United States Patent
Harada et al.

(10) Patent No.: US 9,059,089 B2
(45) Date of Patent: Jun. 16, 2015

(54) METHOD OF MANUFACTURING SEMICONDUCTOR DEVICE

(71) Applicant: Hitachi Kokusai Electric Inc., Tokyo (JP)

(72) Inventors: Kazuhiro Harada, Toyama (JP); Arito Ogawa, Toyama (JP); Hiroshi Ashihara, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/187,799

(22) Filed: Feb. 24, 2014

(65) Prior Publication Data

US 2014/0242790 A1    Aug. 28, 2014

(30) Foreign Application Priority Data

Feb. 28, 2013  (JP) .................................. 2013-039088
Mar. 8, 2013  (JP) .................................. 2013-047105

(51) Int. Cl.
*H01L 21/3205*  (2006.01)
*H01L 21/4763*  (2006.01)
*H01L 21/28*  (2006.01)

(52) U.S. Cl.
CPC ................................. *H01L 21/28008* (2013.01)

(58) Field of Classification Search
None
See application file for complete search history.

(56) References Cited

U.S. PATENT DOCUMENTS

2005/0287804 A1*  12/2005  Vaartstra ........................ 438/676
2008/0268653 A1*  10/2008  Kim et al. ...................... 438/770
2009/0071505 A1*   3/2009  Miya et al. ..................... 134/1.1

FOREIGN PATENT DOCUMENTS

CN         102456552 A  *  5/2012

* cited by examiner

*Primary Examiner* — Charles Garber
*Assistant Examiner* — Abdulfattah Mustapha
(74) *Attorney, Agent, or Firm* — Volpe and Koenig, P.C.

(57) ABSTRACT

A metal-containing film capable of adjusting a work function is formed. A first source containing a first metal element and a halogen element and a second source containing a second metal element different from the first metal element and an amino group are alternately supplied onto a substrate having a high-k dielectric film to form a composite metal nitride film on the high-k dielectric film.

6 Claims, 27 Drawing Sheets

FIG. 9B

| TEMP [°C] | COMPOSITION [atom%] | | | | |
| --- | --- | --- | --- | --- | --- |
| | Ti | Hf | C | N | Cl |
| 300 | 34.4 | 18.0 | 17.0 | 24.3 | 6.3 |
| 330 | 33.9 | 17.1 | 17.5 | 23.5 | 8.0 |
| 350 | 26.4 | 26.1 | 16.4 | 22.7 | 8.3 |

FIG. 10B

| TDEAHf DOSE TIME [sec] | COMPOSITON [atom%] | | | | |
|---|---|---|---|---|---|
| | Ti | Hf | C | N | Cl |
| 10 | 33.9 | 17.1 | 17.5 | 23.5 | 8.0 |
| 30 | 24.1 | 27.2 | 16.8 | 23.9 | 8.0 |

METHOD OF MANUFACTURING SEMICONDUCTOR DEVICE

FIELD OF THE INVENTION

The present invention relates to a method of manufacturing a semiconductor device.

BACKGROUND OF THE INVENTION

In a large-scale integration (LSI) manufacturing process, a transistor structure includes a gate stack structure configured to control a limit voltage of a transistor, in which a high-k dielectric film having a dielectric constant of more than 4 is formed on silicon and a conductive thin film is formed on the high-k dielectric film. In the transistor structure, various conductive thin films are used as a gate electrode to control power consumption of the transistor. These conductive thin films include specific work functions (WF). The threshold voltage of the transistor may be controlled by adjusting the work functions.

When a metal film (metal gate electrode) is formed as a conductive thin film with the miniaturization or complication of device shapes, a method of forming a film using a plurality of material gases has been adopted. With the miniaturization of devices, the width of a space in which the metal film may be deposited is reduced, so that a layer thickness of a gate electrode used to adjust a work function can tend to be reduced. Presently, a metal-containing film which is a metal nitride film [for example, a titanium nitride (TiN) film] has widely been adopted as a metal gate electrode (Patent Document 1).

PRIOR ART DOCUMENTS

Patent Documents

1. Japanese Patent Laid-open Publication No. 2011-6783

DISCLOSURE OF THE INVENTION

Problems to be Solved by the Invention

A metal-containing film having a work function different from a work function of a conventional metal-containing film has been required to improve performance of a transistor. For example, a material having a smaller work function than a titanium nitride (TiN) film is needed for an NMOS-type transistor.

It is a main object of the present invention to form a metal-containing film in which a threshold voltage can be adjusted (tuned), i.e., a work function can be adjusted, in consideration of the above-described object.

According to one aspect of the present invention, there is provided a method of manufacturing a semiconductor device, including alternately supplying a first source containing a first metal element and a halogen and a second source containing a second metal element different from the first metal element and an amino group onto a substrate having a high-k dielectric film to form a composite metal nitride film on the high-k dielectric film.

Effects of the Invention

According to one aspect of the present invention, a metal-containing film in which a limit voltage can be adjusted, i.e., a work function can be adjusted, may be formed.

BRIEF DESCRIPTION OF THE DRAWINGS

FIG. 9B illustrates a composition ratio relative to a predetermined process temperature (film-forming temperature) when the titanium hafnium nitride film is formed.

FIG. 10B illustrates a relationship between a predetermined supply time of TDEAHf per cycle and a composition ratio when the titanium hafnium nitride film is formed.

DETAILED DESCRIPTION OF THE PREFERRED EMBODIMENTS

Figure 1:
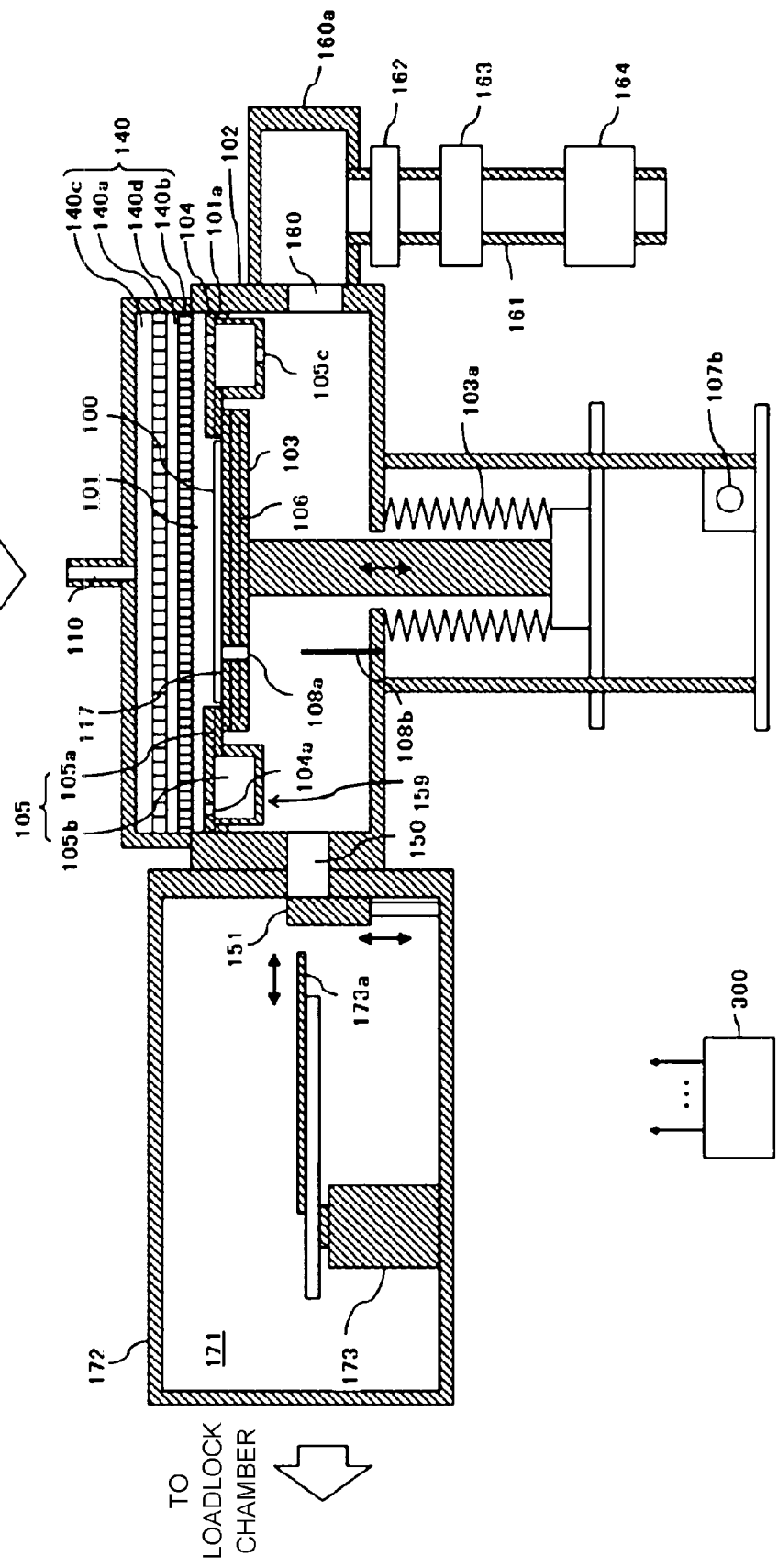
FIG. 1 is a cross-sectional configuration diagram of a substrate processing apparatus according to a first exemplary embodiment of the present invention during the processing of a wafer.

One embodiment of the present invention will now be described with reference to the accompanying drawings below.

Transistors include NMOS-type transistors and PMOS-type transistors. In an NMOS-type transistor, a conductive film in which a work function with respect to a high-k dielectric film is smaller than a middle value (which is called a mid-gap) between a conduction band of a silicon semiconductor and a valence band thereof is initially formed on the high-k dielectric film (first conductive film). Accordingly, to meet the requirement, the first conductive film preferably has a work function of less than 4.5 eV. In contrast, in a PMOS-type transistor, a conductive film having a work function of more than 4.5 eV is used as the first conductive film.

The inventors found the following problems, and found that the problems could be solved by the following invention. In natural science, a work function is defined as energy needed to bring one electron from a substance to an infinite distance, and an NMOS conductive film is basically more susceptible to oxidation than a PMOS conductive film.

When a conductive film is formed using a physical vapor deposition (PVD) process or the above-described method, a portion of an outermost side of the conductive film is slightly oxidized when in contact with the atmosphere. Although an extent of oxidation is affected by incompleteness (defects), a crystal structure, and a physical surface area of a metal, elements constituting the conductive film are essentially robbed of electrons by oxygen having a high electronegativity.

In a transistor in which the minimum dimension of a conventional device exceeds 0.1 µm, since a deposited thin film has a sufficiently great thickness, the influence of the oxidation may be ignored. In addition, since the performance of an NMOS transistor was not particularly rigorously pursued, the great thickness of the deposited thin film had not been noted as a big issue. However, as the minimum dimension of the transistor has been reduced down to 50 nm and additional power reduction has been pursued in a final product having a transistor, the inventors have found that oxidation of a work function adjusting film appropriate for an NMOS transistor leads to serious performance deterioration. Also, when the work function adjusting film appropriate for the NMOS transistor has a thickness of less than 5 nm (5 Å), performance of the work function adjusting film is markedly degraded. Also, when the work function adjusting film appropriate for the NMOS transistor has a thickness of 10 nm or more, it is difficult to maintain a work function of an obtained bulk. Also, when the work function adjusting film is oxidized, the work function of the bulk increases to become closer to that of a PMOS transistor. Even if a thin film is formed according to the present invention, the characteristics of the bulk may be maintained. [First Embodiment]

Hereinafter, exemplary embodiments of the present invention will be described in further detail with reference to the accompanying drawings.

Initially, a substrate processing apparatus used in the exemplary embodiments of the present invention will be described. The substrate processing apparatus is configured as an example of an apparatus for manufacturing a semiconductor device used in a process included in a process of manufacturing a semiconductor device.

In the following description, a case in which a single-wafer-type substrate processing apparatus for performing a film-forming process or the like on a single substrate at one time is used as an example of a substrate processing apparatus will be described.

(1) Structure of Substrate Processing Apparatus

Initially, a structure of a substrate processing apparatus according to the present embodiment will be described with reference to FIG. 1. FIG. 1 illustrates a cross-sectional configuration diagram of a substrate processing apparatus according to an exemplary embodiment of the present invention during the processing of a wafer, and a cross-sectional configuration diagram of the substrate processing apparatus during the transfer of the wafer.

<Process Chamber>

As shown in FIG. 1, the substrate processing apparatus according to the present embodiment includes a process container 102. The process container 102 is configured as, for example, a planar airtight container having a circular cross-section. Also, the process container 102 is formed of a metal material, for example, aluminum (Al) or stainless steel (SUS), or quartz ($SiO_2$). A process chamber 101 for processing a wafer 100 (e.g., silicon wafer) which is a substrate is formed in the process container 102.

<Support Stage>

A support stage 103 for supporting the wafer 100 is installed in the process chamber 101. The support stage 103 is formed of, for example, quartz ($SiO_2$), carbon, ceramics, silicon carbide (SiC), aluminum oxide ($Al_2O_3$), or aluminum nitride (AlN). A susceptor 117 which is a support plate formed of, for example, quartz ($SiO_2$), carbon, ceramics, silicon carbide (SiC), aluminum oxide ($Al_2O_3$), or aluminum nitride (AlN) may be installed on a top surface of the support stage 103 which is in direct contact with the wafer 100. Also, a heater 106 which is a heating unit (heating source) for heating the wafer 100 may be embedded in the support stage 103. In addition, a lower end portion of the support stage 103 penetrates a bottom portion of the process container 102.

<Elevating Mechanism>

An elevating mechanism 107b is installed outside the process chamber 101 and connected to the lower end portion of the support stage 103. By moving the support stage 103 upward/downward by operating the elevating mechanism 107b, the wafer 100 supported on the susceptor 117 may be moved upward/downward. The support stage 103 may move downward to a height of a wafer transfer port 150 to be described later during the transfer of the wafer 100, while the support stage 103 may move upward to a wafer process position (shown position) during the processing of the wafer 100. Also, the circumference of the lower end portion of the support stage 103 may be coated with a bellows 103a, and the inside of the process chamber 101 may be air-tightly retained.

<Lift Pin>

For example, three lift pins 108b are installed on a lower surface (bottom surface) of the process chamber 101 to rise [be erected] in a vertical direction. Also, through holes 108a are respectively penetrated by the lift pins 108b and installed in positions corresponding to the lift pins 108b in a support stage 103 [susceptor 117]. When the support stage 103 is moved downward to a wafer transfer position, upper end portions of the lift pins 108b protrude from a top surface of the susceptor 117 via the through holes 108a so that the lift pins 108b can support the wafer 100 from below. Also, when the support stage 103 is moved upward to a wafer process position, the lift pins 108b are buried from the top surface of the susceptor 117 so that the susceptor 117 can support the wafer 100 from below. Since the lift pins 108b are in direct contact with the wafer 100, the lift pins 108b are preferably formed of, for example, a material such as quartz or alumina.

<Wafer Transfer Port>

A wafer transfer port 150 for transferring the wafer 100 into/from the process chamber 101 is installed in a side surface of an inner wall of the process chamber 101 [process container 102]. A gate valve 151 is installed at the wafer transfer port 150, and the inside of the process chamber 101 is in communication with the inside of a transfer chamber 171 (preliminary chamber) by opening the gate valve 151. The transfer chamber 171 is formed in a transfer container 172 (air-tight container), and a transfer robot 173 for transferring the wafer 100 is installed in the transfer chamber 171. The transfer robot 173 includes a transfer arm 173a for supporting the wafer 100 during the transfer of the wafer 100. By opening the gate valve 151 while moving the support stage 103 downward to a wafer transfer position, the wafer 100 may be transferred by the transfer robot 173 between the inside of the process chamber 101 and the inside of the transfer chamber 171. As described above, the wafer 100 transferred into the process chamber 101 is temporarily placed on the lift pins 108b. Also, a loadlock chamber (not shown) is installed at the opposite side to a side at which the wafer transfer port 150 of the transfer chamber 171 is installed, and the wafer 100 may be transferred by the transfer robot 173 between the inside of the loadlock chamber and the inside of the transfer chamber 171. Also, the loadlock chamber functions as a preliminary chamber for temporarily accommodating unprocessed or completely processed wafers 100.

<Exhaust System>

An exhaust port 160 for exhausting an atmosphere of the process chamber 101 is installed in the side surface of the inner wall of the process chamber 101 [process container 102] at the opposite side of the wafer transfer port 150. An exhaust pipe 161 is connected to the exhaust port 160 via an exhaust chamber 160a, and a pressure adjustor 162 (e.g., auto pressure controller (APC)) which is a pressure control device for controlling the inside of the process chamber 101 to a predetermined pressure, a source recovery trap 163, and a vacuum pump 164 are sequentially connected in series to the exhaust pipe 161. An exhaust system (exhaust line) is mainly configured by the exhaust port 160, the exhaust pipe 161, and the pressure adjustor 162. Although the source recovery trap 163 and the vacuum pump 164 are installed at a semiconductor manufacturing factory at which the substrate processing apparatus is installed, the source recovery trap 163 and the vacuum pump 164 may be installed in the substrate processing apparatus.

<Gas Introduction Port>

A gas introduction port 110 for supplying various gases into the process chamber 101 is installed in a top surface (ceiling wall) of a shower head 140 to be described below installed over the process chamber 101. Also, a structure of a gas supply system connected to the gas introduction port 110 will be described below.

<Shower Head>

The shower head 140 which is a gas dispersion mechanism is installed between the gas introduction port 110 and the process chamber 101. The shower head 140 includes a dispersion plate 140a configured to disperse a gas introduced from the gas introduction port 110 and a shower plate 140b configured to further uniformly disperse a gas passing through the dispersion plate 140a and supply the gas to a surface of the wafer 100 disposed on the support stage 103. A plurality of bent holes are installed in the dispersion plate 140a and the shower plate 140b. The dispersion plate 140a is disposed opposite to a top surface of the shower head 140 and the shower plate 140b, and the shower plate 140b is disposed opposite to the wafer 100 disposed on the support stage 103. Also, spaces are respectively installed between the top surface of the shower head 140 and the dispersion plate 140a and between the dispersion plate 140a and the shower plate 140b. These spaces respectively serve as a first buffer space 140c (dispersion chamber) configured to disperse gases supplied from the gas introduction port 110 and a second buffer space 140d configured to disperse gases passing through the dispersion plate 140a.

<Exhaust Duct>

A stepped portion 101a is installed in the side surface of the inner wall of the process chamber 101 [process container 102]. The stepped portion 101a is configured to retain a conductance plate 104 near the wafer process position. The conductance plate 104 is configured as a single donut-shaped (ring-shaped) circular plate in which a hole accommodating the wafer 100 is installed in an inner circumferential portion thereof. A plurality of discharge ports 104a are installed in an outer circumferential portion of the conductance plate 104 and arranged at predetermined intervals in a circumferential direction. The discharge ports 104a are discontinuously formed such that the outer circumferential portion of the conductance plate 104 may support the inner circumferential portion thereof.

Meanwhile, a lower plate 105 is suspended on an outer circumferential portion of the support stage 103. The lower plate 105 includes a ring-shaped concave portion 105b and a flange portion 105a integrally installed on an inner side of the concave portion 105b. The concave portion 105b is installed to block a gap between the outer circumferential portion of the support stage 103 and the side surface of the inner wall of the process chamber 101. A plate exhaust port 105c for discharging (circulating) gases from the inside of the concave portion 105b to a side of the exhaust port 160 is installed in a portion of a bottom portion of the concave portion 105b near the exhaust port 160. The flange portion 105a functions as a suspension portion suspended on an upper outer peripheral edge of the support stage 103. By suspending the flange portion 105a on the upper outer peripheral edge of the support stage 103, the lower plate 105 moves upward/downward along with the support stage 103 during the upward/downward movement of the support stage 103.

When the support stage 103 moves upward to the wafer process position, the lower plate 105 also moves upward to the wafer process position. As a result, the conductance plate 104 retained near the wafer process position blocks a top surface of the concave portion 105b, and an exhaust duct 159 is formed using the inside of the concave portion 105b as a gas flow path region. In this case, due to the exhaust duct 159 [the conductance plate 104 and the lower plate 105] and the support stage 103, the inside of the process chamber 101 is divided into an upper process chamber disposed above the exhaust duct 159 and a lower process chamber disposed below the exhaust duct 159. Also, the conductance plate 104 and the lower plate 105 are preferably formed of a material capable of retaining a high temperature, for example, high-temperature-resistant, high-load quartz, in consideration of a case in which reaction products deposited on an inner wall of the exhaust duct 159 are etched (a self-cleaning process is performed).

Hereinafter, the flow of gases in the process chamber 101 during the processing of wafers will be described. Initially, gases supplied from the gas introduction port 110 over the shower head 140 flow from a plurality of holes of the dispersion plate 140a through the first buffer space 140c (dispersion chamber) into the second buffer space 140d and are also supplied through a plurality of holes of the shower plate 140b into the process chamber 101 and uniformly supplied onto the wafer 100. Also, the gases supplied onto the wafer 100 radially flow toward an outer side of a radial direction of the wafer 100. Also, after contacting the wafer 100, the remnant gases radially flow on the exhaust duct 159 disposed on an outer circumferential portion of the wafer 100, that is, on the conductance plate 104, toward the outer side of the radial direction of the wafer 100, and are discharged from the discharge ports 104a installed in the conductance plate 104 into the gas flow path region [into the concave portion 105b] of the exhaust duct 159. Thereafter, the gases flow into the exhaust duct 159 and are exhausted via the plate exhaust port 105c from the exhaust port 160. By supplying the gases as described above, the gases are inhibited from returning to a lower portion of the process chamber 101, that is, a back side of the support stage 103 or a bottom surface of the process chamber 101.

<Gas Supply System>

Figure 2:
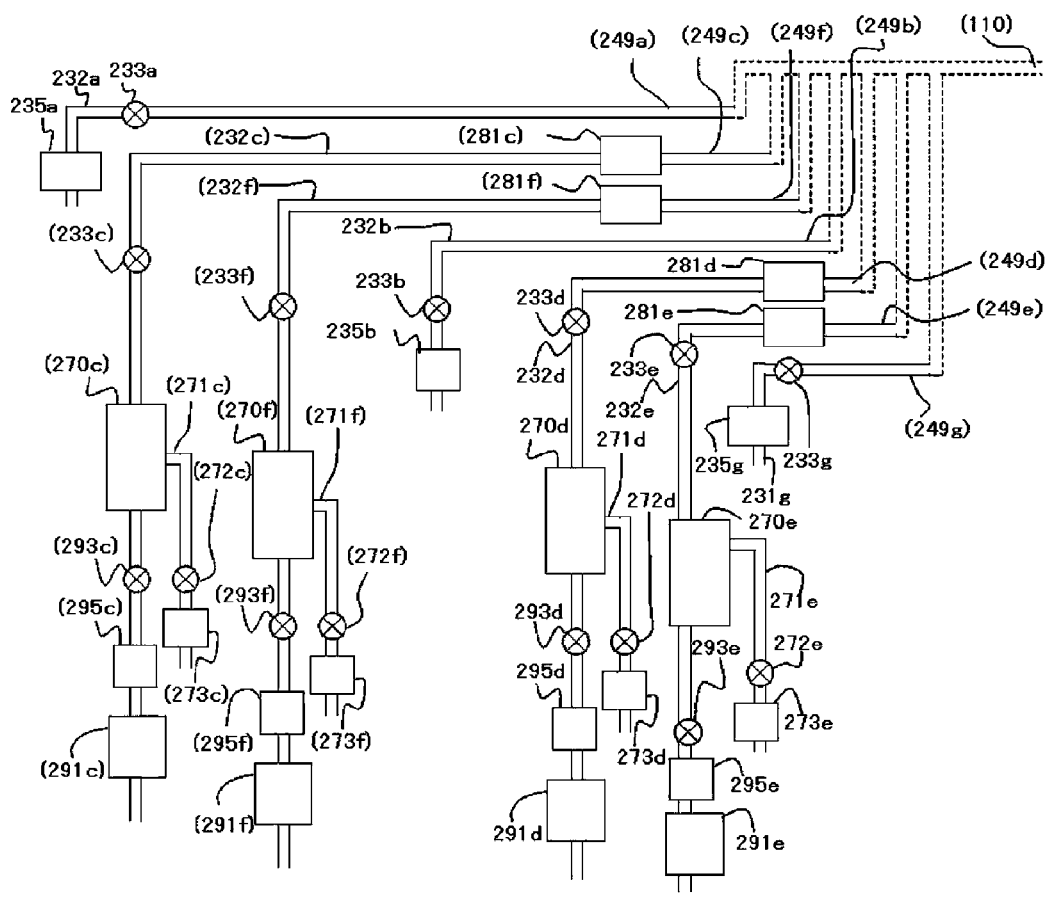
FIG. 2 is a configuration diagram of a gas supply system of the substrate processing apparatus shown in FIG. 1.

Next, a structure of a gas supply system connected to the above-described gas introduction port 110 will be described with reference to FIG. 2. FIG. 2 is a construction diagram of a gas supply system including the gas processing apparatus according to the present embodiment.

A mass flow controller (MFC) 235g which is a flow rate control device (flow rate control unit) and a valve 233g which is an opening/closing valve are sequentially installed at a gas supply pipe 232g from an upstream side. For example, $N_2$, which is an inert gas, is supplied via the gas supply pipe 232g into a gas introduction port 110. A second inert gas supply system is mainly configured by the gas supply pipe 232g, the MFC 235g, and the valve 233g.

An inert gas supply system is configured by any one of the first inert gas supply system and the second inert gas supply system or both of them. Although the first inert gas supply system and the second inert gas supply system may be selectively used according to the processing of the substrate, a uniform processing process may be performed on the wafer 100 using both the first inert gas supply system and the second inert gas supply system.

[Source Supply System]

A source tank 291d, a liquid MFC (LMFC) 295d, and a valve 293d are sequentially installed at an upstream side of a vaporizer 270d connected to the gas supply pipe 232d. An amount of a liquid source supplied into the vaporizer 270d [i.e., a supply flow rate of a gas which is vaporized in the vaporizer 270d and supplied into the process chamber 101] is controlled by the LMFC 295d. A first source supply system (first liquid source supply system) is mainly configured by the gas supply pipe 232d, the LMFC 295d, and the valve 293d. Also, the first source supply system may further include the liquid source tank 291d. The first source supply system also functions as a third source supply system (third liquid supply system) as described below.

A source (liquid source) tank 291e, an LMFC 295e, and a valve 293e are sequentially installed at an upstream side of a vaporizer 270e connected to the gas supply pipe 232e from an upstream side. An amount of a liquid source supplied into the vaporizer 270e [i.e., a supply flow rate of a gas which is vaporized in the vaporizer 270e and supplied into the process chamber 101] is controlled by the LMFC 295e. A second source supply system (second liquid source supply system) is mainly configured by the gas supply pipe 232e, the LMFC 295e, and the valve 293e. The second source supply system may further include the source tank 291e.

[Carrier Gas Supply System]

An inert gas which is a carrier gas is supplied from the gas supply pipe 271d into a vaporizer 270d. An MFC 273d and a valve 272d are installed at the gas supply pipe 271d. By diluting a vaporization gas generated by the vaporizer 270d with the carrier gas, processing uniformity (e.g., uniformity in in-plane layer thickness) of the wafer 100 mounted on the susceptor 117 may be adjusted. A first carrier gas supply system is mainly configured by the gas supply pipe 271d, the MFC 273d, and the valve 272d.

An inert gas which is a carrier gas is supplied into the vaporizer 270e from a gas supply pipe 271e. An MFC 273e and a valve 272e are installed at the gas supply pipe 271e. By diluting a vaporization gas generated by the vaporizer 270e with the carrier gas, processing uniformity (e.g., uniformity in in-plane layer thickness) of the wafer 100 mounted on the susceptor 117 may be adjusted. A second carrier gas supply system is mainly configured of the gas supply pipe 271e, the MFC 273e, and the valve 272e.

A first source (first liquid source) containing a metal element (first metal element) and a halogen element is supplied from the gas supply pipe 232d via the LMFC 295d, the vaporizer 270d, and a gas filter 281d into the process chamber 101. In the present embodiment, titanium (Ti), which is a transition metal element, is selected as the metal element, and chlorine (Cl) is selected as the halogen element. Here, titanium tetrachloride ($TiCl_4$) is used as a source containing titanium and chlorine. $TiCl_4$ is a liquid at normal temperature and pressure. $TiCl_4$ is stored in a liquid state in the source tank 291d.

Although an example in which titanium, which is a transition metal element, is used as the metal element has been described, the present invention is not limited thereto. The metal element may be a transition metal selected from a group consisting of tungsten (W), tantalum (Ta), zirconium (Zr), hafnium (Hf), ruthenium (Ru), cobalt (Co), and nickel (Ni). As sources containing these transition metal elements and a halogen element, for example, tungsten fluoride ($WF_6$), tantalum chloride ($TaCl_5$), zirconium chloride ($ZrCl_4$), hafnium chloride ($HfCl_4$), tungsten chloride ($WCl_6$) or the like may be used. Also, a metal element other than a transition metal may be used. When the sources containing the transition metal elements and the halogen element are in a solid state at normal temperature and pressure, the vaporizer 270d may not be used, and an MFC may be appropriately used instead of an LMFC. The first source is used as the third source as will be described below.

A source containing a metal element (second metal element) and an amino group is supplied from the gas supply pipe 232e via the MFC 295e, the vaporizer 270e, and the gas filter 281e into the process chamber 101. An element different from the first metal element is selected as the second metal element. In the present embodiment, hafnium (Hf), which is a transition metal element, is selected as the second metal element. Here, tetrakis(dimethylamino)hafnium (Hf[N($C_2H_5$)$_2$]$_4$, abbreviated as TDEAHf) is used as the source containing hafnium and the amino group. TDEAHf is a liquid at normal temperature and pressure. The TDEAHf is stored in a liquid state in the source supply tank 291e.

A ligand of an amino group contained in TDEAHf may contain an ethyl group, but is not limited thereto. The ligand of the amino group contained in TDEAHf may contain a methyl group, an ethyl group, both of them, or a cyclopenta-based group. For example, as a hafnium-containing second source, tetrakis(dimethylamino)hafnium (Hf[N(CH$_3$)$_2$]$_4$; TDMAHf) or tetrakis(ethylmethylamino)hafnium (Hf[N(C$_2$H$_5$)CH$_3$]$_4$; TEMAHf) may be used.

Although an example in which hafnium, which is a transition metal element, is used as the second metal element has been described, the present invention is not limited thereto. The second metal element may be a transition metal selected from a group consisting of tungsten (W), tantalum (Ta), zirconium (Zr), hafnium (Hf), ruthenium (Ru), cobalt (Co), and nickel (Ni). Also, a metal element other than a transition metal may be used. However, a metal element different from the first metal element is selected as the second metal element. As the source containing the metal element and the amino group, for example, tris(dimethylamino)aluminum (Al[N(CH$_3$)$_2$]$_3$), tetrakis(diethylamino)zirconium (Zr[N(C$_2$H$_5$)$_2$]$_4$), tetrakis(dimethylamino)zirconium (Z[N(CH$_3$)$_2$]$_4$), tetrakis(ethylmethylamino)zirconium (Zr[N(C$_2$H$_5$)CH$_3$]$_4$), tert-butylimino tris(ethylmethylamino)tantalum (TBTEMT), tert-butylimino tris(diethylamino)tantalum (TBTDET), or bis(tert-butylimino)bis(dimethylamino)tungsten (BTBMW), etc. may be used.

[Reactive Gas Supply System]

An MFC 235b which is a flow rate control device (flow rate controller) and a valve 233b which is an opening/closing valve are sequentially installed at the gas supply pipe 232b in an upstream direction. A reactive gas supply system is mainly configured by the gas supply pipe 232b, the MFC 235b, and the valve 233b. A fourth source containing nitrogen is supplied from the gas supply pipe 232b via the MFC 235b and the valve 233b into the process chamber 101. Here, ammonia (NH$_3$) is used as the nitrogen-containing source. Also, the fourth source containing nitrogen is not limited to ammonia, and N$_2$, nitrous oxide (NO), or nitric oxide (N$_2$O) may be used.

[Control Unit]

Figure 3:
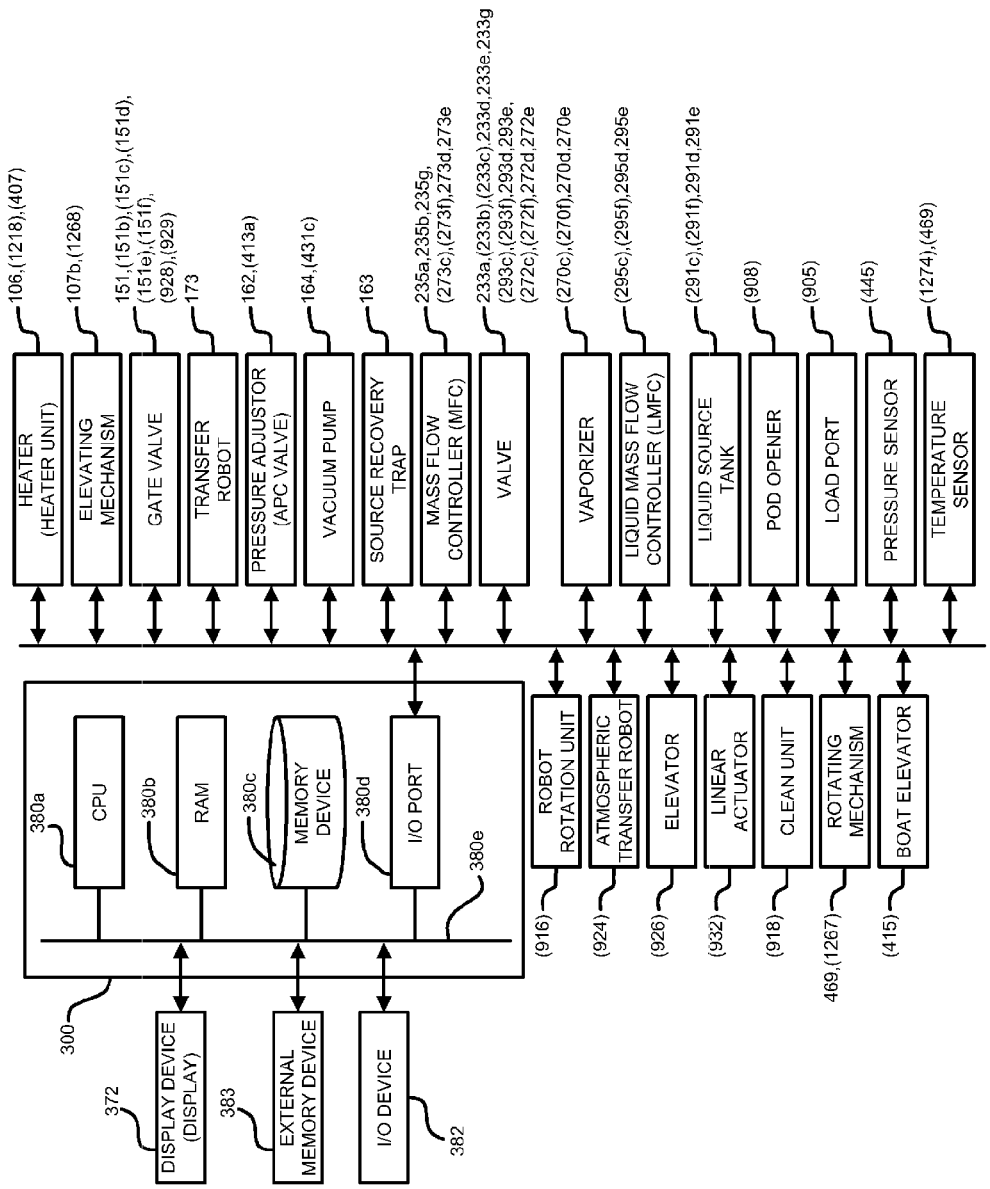
FIG. 3 is a schematic configuration diagram of a controller of the substrate processing apparatus shown in FIG. 1.

FIG. 3 illustrates an example of connection of a control unit with respective components according to the present embodiment. A controller 300 which is a control unit (control means) is configured as a computer including a central processing unit (CPU) 380a, a random access memory (RAM) 380b, a memory device 380c, and an input/output (I/O) port 380d. The RAM 380b, the memory device 380c, and the I/O port 380d are configured to exchange data with the CPU 380a via an internal bus 380e. An I/O device 382 configured, for example, as a touch panel or the like is connected to the controller 300.

The memory device 380c is configured, for example, as a flash memory, a hard disk drive (HDD), or the like. In the memory device 380c, a control program for controlling an operation of a substrate processing apparatus or a process recipe including an order or conditions of substrate processing which will be described below is stored to be readable. The process recipe is a combination of sequences of a substrate processing process which will be described below to obtain a desired result when the sequences are performed by the controller 300, and acts as a program. Hereinafter, the process recipe, the control program, etc. will also be referred to together simply as a 'program.' Also, when the term 'program' is used in the present disclosure, it should be understood as including only a process recipe, only a control program, or both of the process recipe and the control program. The RAM 380b is configured as a work area in which a program or data read by the CPU 380a is temporarily stored.

The I/O port 380d is connected to the heater 106, the elevating mechanism 107b, the gate valve 151, the transfer robot 173, the pressure adjustor 162, the vacuum pump 164, the source recovery trap 163, the MFCs 235a, 235b, 235g, 273d, and 273e, the valves 233a, 233d, 233e, 233g, 293d, 293e, 272d, and 272e, the vaporizers 270d and 270e, the LMFCs 295d and 295e, the liquid source tanks 291d and 291e, etc. Components denoted by symbols in parentheses described in FIGS. 2 and 3 are components used in other embodiments described below. In the respective embodiments, only necessary components described in FIG. 3 are connected to the I/O port 380d.

The CPU 380a is configured to read and execute the control program from the memory device 380c and to read the process recipe from the memory device 380c according to a manipulation command received via the I/O device 382. Also, according to the read process recipe, the CPU 380a is configured to control flow rates of various gases via the MFCs 235a, 235b, 235g, 273d, and 273e; control flow rates of liquid sources via the LMFCs 295d and 295e; control opening/closing of the valves 233a, 233d, 233e, 233g, 293d, 293e, 272d, and 272e; control the degree of pressure using the pressure adjustor 162; control temperature using the heater 106; control driving/suspending of the vacuum pump 164; control upward/downward movement of the support stage 103 using the elevating mechanism 107b, etc.

The controller 300 is not limited to a dedicated computer and may be configured as a general-purpose computer. For example, the controller 300 according to the present embodiment may be configured by preparing an external memory device 383 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory (USB flash drive), a memory card, etc.), and then installing the program in a general-purpose computer using the external memory device 383. Also, means for supplying a program to a computer are not limited to using the external memory device 383. For example, a program may be supplied to a computer using communication means, e.g., the Internet or an exclusive line, without using the external memory device 383. The memory device 380c or the external memory device 383 may be configured as a non-transitory computer-readable recording medium. Hereinafter, the memory device 380c and the external memory device 383 may also be referred to together simply as a 'recording medium.' Also, when the term 'recording medium' is used in the present disclosure, it may be understood as only the memory device 380c, only the external memory device 383, or both the memory device 380c and the external memory device 383.

<Structure of Semiconductor Device>

Next, an example of a structure of a semiconductor device according to the present embodiment will be described. Here, an NMOS transistor will be described as an example of the semiconductor device.

Figure 4:
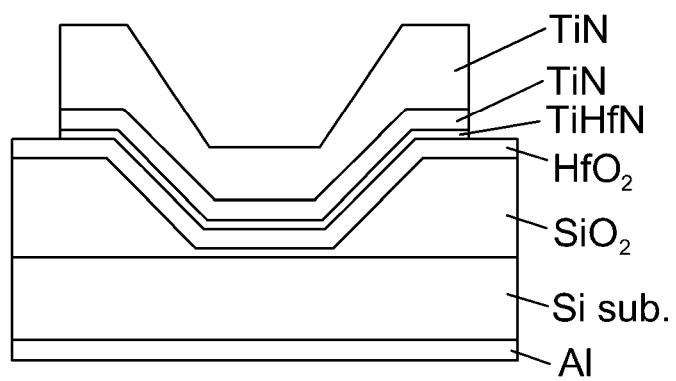
FIG. 4 is a diagram illustrating an example of a configuration of a gate of an NMOS-type transistor according to an exemplary embodiment of the present invention.

FIG. 4 is a diagram illustrating an example of a structure of a gate of an NMOS transistor. As shown in FIG. 4, the gate includes a stacked structure formed by stacking a silicon-based insulating film formed on a silicon substrate and formed of silicon oxide (SiO$_2$), a high-k dielectric film formed on the silicon oxide and formed of hafnium oxide (HfO$_2$), and a gate electrode formed on the hafnium oxide and formed of a composite metal nitride film (a TiHfN film, which is a compound transition metal nitride film). Also, a cap film formed of a metal nitride film (a TiN film, which is a transition metal nitride film) is formed on the TiHfN film. Also, an aluminum film is formed on a back side of the silicon substrate.

<Process of Forming Gate of Semiconductor Device>

Figure 5:
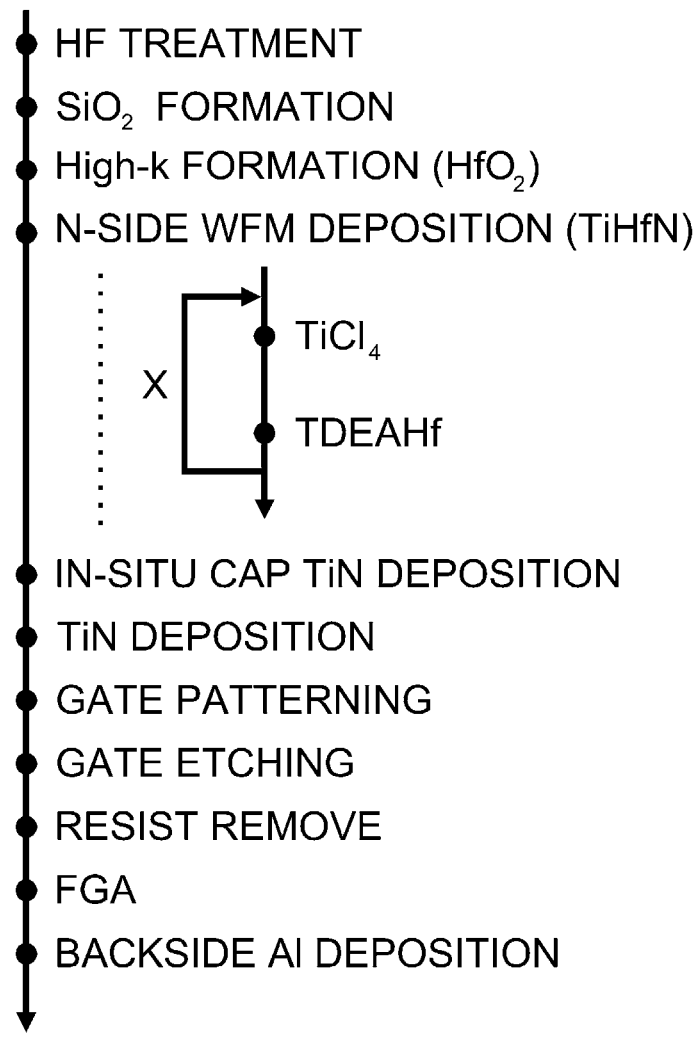
FIG. 5 is a process flowchart illustrating an example of a process of manufacturing a gate of the NMOS-type transistor shown in FIG. 4.

Next, an example of a process of forming the gate shown in FIG. 4 will be described with reference to FIG. 5. FIG. 5 is a process flowchart illustrating an example of a process of forming a gate of an NMOS transistor.

Initially, a silicon substrate is processed with, for example, a 1% water solution to remove a sacrificial oxide film from the silicon substrate ("HF treatment" process). Thereafter, a silicon oxide ($SiO_2$) film is formed on the surface of the silicon substrate due to thermal oxidation ("$SiO_2$ formation" process). The silicon oxide film is formed as an interfacial layer at the silicon substrate and hafnium oxide ($HfO_2$) to be formed thereafter.

Next, a hafnium oxide film is formed as a high-k dielectric film on the silicon oxide film ("high-k formation" process). The silicon oxide film and the hafnium oxide film constitute a gate insulating film. Next, a composite metal nitride film is formed as a gate electrode on the hafnium oxide film ("N-side WFM deposition" process). In the present embodiment, a titanium hafnium nitride (TiHfN) film is formed as the composite metal nitride film. As shown, in the present process, the first source ($TiCl_4$) and the second source (TDEAHf) as described above are alternately supplied in X cycles.

Thereafter, a titanium nitride (TiN) film is formed as a cap layer on the titanium hafnium nitride film in situ ("in-situ cap TiN deposition" process). Also, a titanium nitride film is formed using, for example, a physical vapor deposition (PVD) process ("TiN deposition" process). The gate electrode is patterned on the titanium nitride film through a photolithography technique using a resist as a mask ("gate patterning" process), and a pattern etching process is performed using a dry etching technique ("gate etching" process). Next, the resist is removed ("resist removal" process). A forming gas annealing (FGA) process, such as a hydrogen gas annealing process or the like, is performed ("FGA" process). Thereafter, an aluminum layer is formed on the backside of the silicon substrate ("backside Al deposition" process).

<Processes of Forming TiHfN Film and TiN Film>

Next, a process of forming a composite metal nitride film (TiHfN) constituting the above-described gate electrode and a process of forming a metal nitride film (TiN film) constituting a cap film will be described. Each of the film-forming processes is performed in the process chamber 101 of the above-described substrate processing apparatus.

Figure 6:
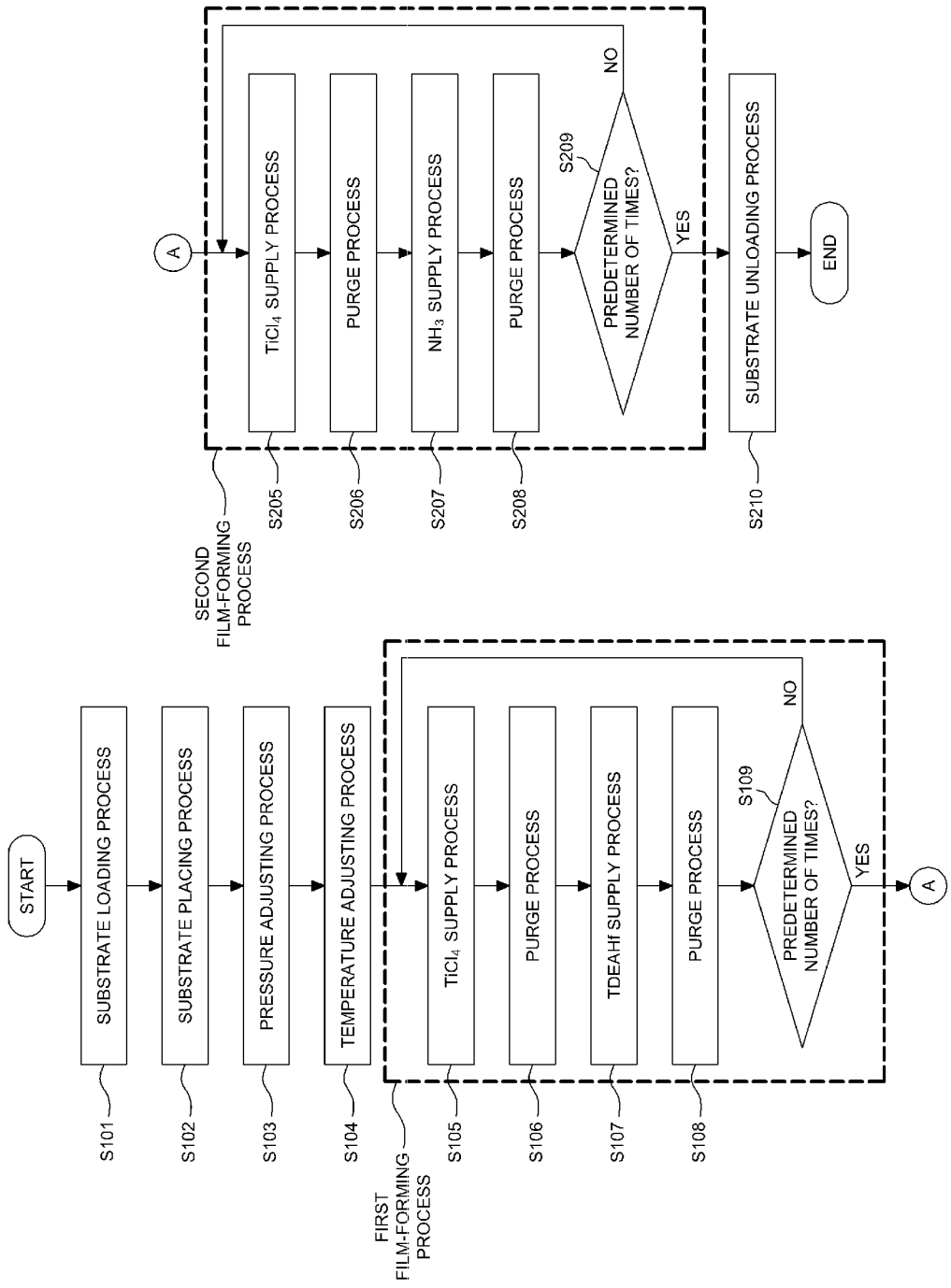
FIG. 6 is a process flowchart illustrating an example of a film-forming process in the process flow shown in FIG. 5.
Figure 7A:
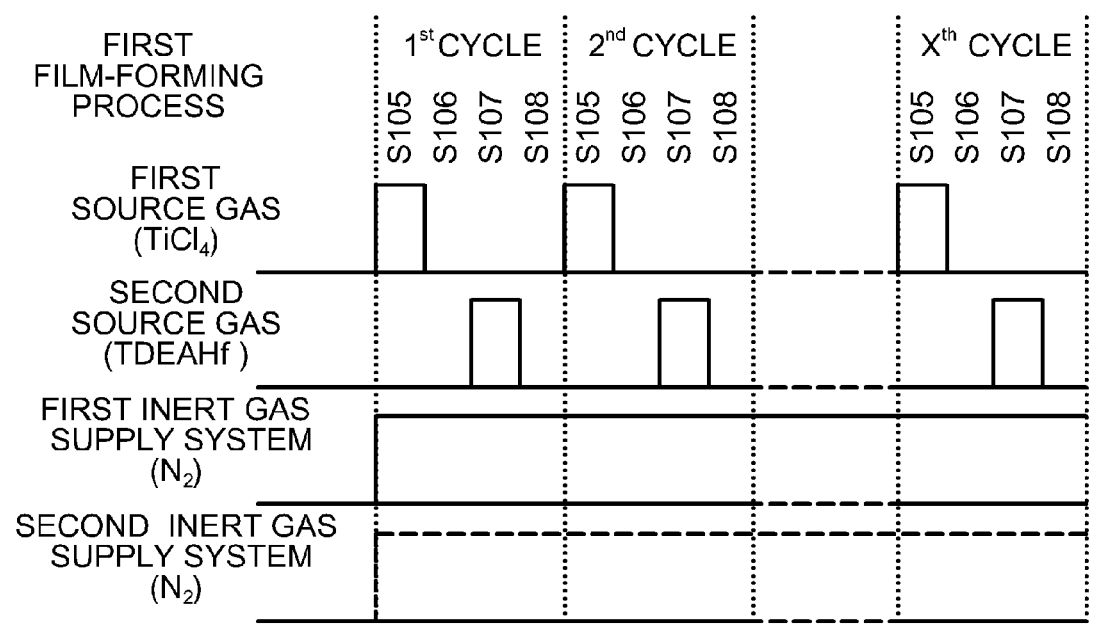
FIG. 7A is a diagram illustrating gas supply timing in a first film-forming process shown in FIG. 6.
Figure 7B:
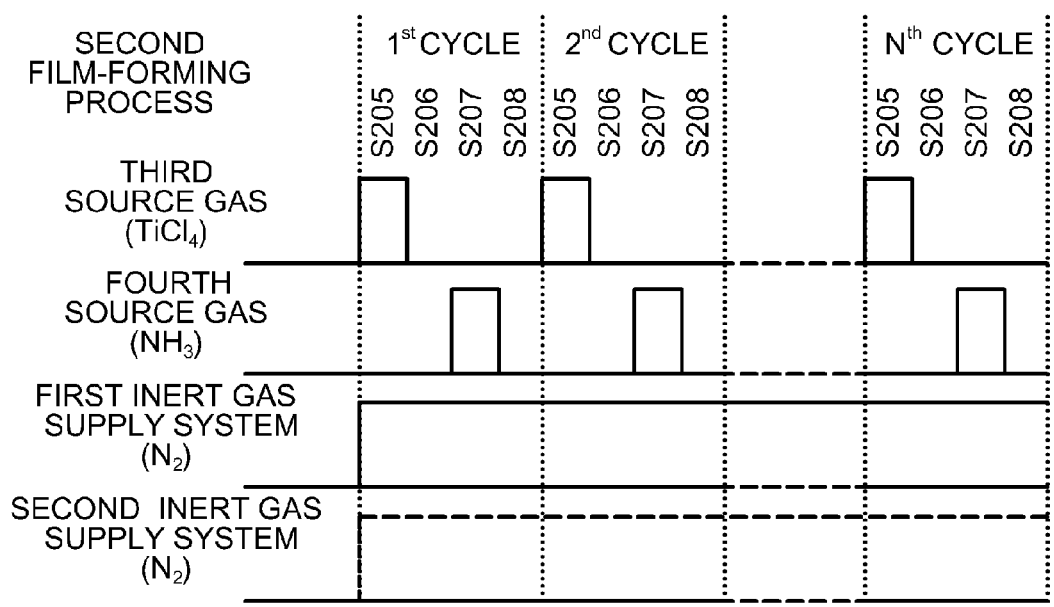
FIG. 7B is a diagram illustrating gas supply timing in a second film-forming process shown in FIG. 6.

FIG. 6 is a process flowchart illustrating examples of a process of forming a composite metal nitride film (TiHfN film) and a process of forming a metal nitride film (TiN film) in the process flowchart shown in FIG. 5. FIG. 7 is a diagram illustrating gas supply timing in the film-forming process shown in FIG. 6. In the following description, an operation of each component of the substrate processing apparatus is controlled by a controller 300.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied onto a wafer' should be understood to mean that the specific gas is directly supplied onto a surface (exposed surface) of the wafer itself or that the specific gas is supplied onto a surface of a layer/film on the wafer, i.e., on the uppermost surface of the wafer as a stacked structure. Also, in the present disclosure, the expression 'a specific layer (or film) is formed on the wafer' should be understood to mean that the specific layer (or film) is directly formed on a surface (exposed surface) of the wafer itself or that the specific layer (or film) is formed on the layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

[Substrate Loading Process S101]

Initially, the gate valve 151 installed at the wafer transfer port 150 is opened so that the wafer 100 may be transferred by the transfer robot 173 from the transfer chamber 171 into the process chamber 101. The above-described high-k dielectric film ($HfO_2$) is formed on the wafer 100. As the high-k dielectric film, a film formed of one of aluminum oxide (AlO), zirconium oxide (ZrO), lanthanum oxide (LaO), yttrium oxide (YO), tantalum oxide (TaO), cerium oxide (CeO), titanium oxide (TiO), strontium titanate (STO), and barium titanate (BTO) or a combination of at least two thereof may be used. Also, these films may further include silicon oxide (SiO) or silicon nitride (SiN). For example, ZrAlO, HfAlO, LaAlO, HfSiO, HfSiON, or ZrSiO may be used. Preferably, an oxide film containing a transition metal may be used. The high-k dielectric film preferably has a dielectric constant of 4.0 or more.

[Substrate Placing Process S102]

The wafer 100 transferred into the process chamber 101 is placed on the susceptor 117 and heated by a preheated susceptor 117.

[Pressure Control Process S103]

When the wafer 100 is placed on the susceptor 117, the gate valve 151 is closed off, and the inside of the process chamber 101 is vacuum-exhausted by the vacuum pump 164 to have a desired pressure (degree of vacuum). In this case, the pressure in the process chamber 101 is measured by a pressure sensor (not shown), and the APC valve 162 is feedback-controlled (pressure control).

[Temperature Control Process S104]

The wafer 100 is heated by the heater 106 to have a desired temperature. In this case, an amount of current supplied to the heater 106 is feedback-controlled based on temperature information detected by a temperature sensor (not shown), so that the wafer 100 may have a desired temperature distribution (temperature control).

The above-described control of the pressure and temperature is continuously performed at least until the processing of at least the wafers 100 is completed.

Next, a first film-forming process of forming a TiHfN film which is a composite metal nitride film is performed by alternately supplying $TiCl_4$ and TDEAHf onto the wafer 100. In the first film-forming process, the following four steps are sequentially performed.

[First Film-Forming Process (TiHfN Film-Forming Process)]

<Step S105>

In step S105, $TiCl_4$ (first source) is supplied into the process chamber 101. Specifically, the valves 233d and 293d of the gas supply pipe 232d are opened, and $TiCl_4$ gas is supplied via the vaporizer 270d and the gas filter 281d into the gas supply pipe 232d. The flow rate of the $TiCl_4$ gas supplied into the gas supply pipe 232d is adjusted by the LMFC 295d. The $TiCl_4$ gas, the flow rate of which is adjusted, is supplied from the gas supply pipe 232d via the gas introduction port 110 onto the wafer 100 in the process chamber 101, and exhausted from the exhaust port 161. At the same time, the valve 272d is opened to supply N₂ gas as an inert gas into the inert gas supply pipe 271d. The flow rate of the N₂ gas flowing in the inert gas supply pipe 271d is adjusted by the MFC 273d. The N₂ gas, the flow rate of which is adjusted, is supplied into the process chamber 101 together with the TiCl₄ gas, and exhausted from the exhaust port 161. Also, the valve 233a may be opened to supply N₂ gas as an inert gas from the gas supply pipe 232a. The valve 233g may be opened to supply N₂ gas as an inert gas from the gas supply pipe 232g.

In this case, the APC valve 162 is appropriately adjusted to set the pressure in the process chamber 101 to be within a range of, for example, 20 to 1,330 Pa. The supply flow rate of the TiCl₄ gas controlled by the LMFC 295d is set to be within, for example, a range of 10 to 100 ccm. A duration for which the wafer 100 is exposed to the TiCl₄ gas, i.e., a gas supply time (gas irradiation time), is set to be within, for example, a range of 0.01 to 300 seconds. In this case, the temperature of the heater 106 is set such that the temperature of the wafer 100 falls within, for example, a range of 100 to 400° C., preferably 200 to 400° C., and more preferably 240 to 350° C. The flow rate of N₂ gas supplied as an inert gas at the same time with the TiCl₄ gas is set to be within a range of, for example, 0 to 200 ccm. By supplying the TiCl₄ gas, for example, a titanium-containing layer having a thickness of less than one atomic layer to several atomic layers is formed on the wafer 100.

<Step S106>

In step S106, the valve 233d is closed, and the supply of TiCl₄ gas into the process chamber 101 is stopped. In this case, the inside of the process chamber 101 is vacuum-exhausted by the vacuum pump 164 while the APC valve 162 is open, thereby eliminating the TiCl₄ gas (that does not react or that has contributed to the formation of the titanium-containing layer) remaining in the process chamber 101 from the process chamber 101. In this case, N₂ gas is supplied into the process chamber 101 while the valve 233a or the valve 233g is open (or by opening the valve 233a or the valve 233g). The N₂ gas acts as a purge gas to increase the effect of eliminating the TiCl₄ gas (that does not react or that has contributed to the formation of the titanium-containing layer) remaining in the process chamber 101 from the process chamber 101. The process chamber 101 may be purged by supplying the N₂ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, step S107 to be performed thereafter will not be badly influenced by the gas. In this case, the flow rate of the N₂ gas to be supplied into the process chamber 101 need not be high. For example, the inside of the process chamber 101 may be purged without causing step S107 to be badly influenced by the gas by supplying an amount of a gas corresponding to the capacity of the process chamber 101. As described above, when the inside of the process chamber 101 is not completely purged, a purge time may be reduced to improve the throughput. Furthermore, the consumption of the N₂ gas may be suppressed to a necessary minimum level.

<Step S107>

In step S107, TDEAHf (second source) is supplied into the process chamber 101. Specifically, the valves 233e and 293e of the gas supply pipe 232e are opened, and TDEAHf gas is supplied via the vaporizer 270e and the gas filter 281e into the gas supply pipe 232e. The flow rate of the TDEAHf gas flowing in the gas supply pipe 232e is adjusted by the LMFC 295e. The TDEAHf gas, the flow rate of which is adjusted, is supplied from the gas supply pipe 232e via the gas introduction port 110 onto the wafer 100 in the process chamber 101, and exhausted from the exhaust port 161. At the same time, the valve 272e is opened to supply N₂ gas as an inert gas into the inert gas supply pipe 271e. The flow rate of the N₂ gas flowing in the inert gas supply pipe 271e is adjusted by the MFC 273e. The N₂ gas, the flow rate of which is adjusted, is supplied into the process chamber 101 together with the TDEAHf gas, and exhausted from the exhaust port 161. Also, the valve 233a may be opened to supply N₂ gas as an inert gas from the gas supply pipe 232a. The valve 233g may be opened to supply N₂ gas as an inert gas from the gas supply pipe 232g.

In this case, the APC valve 162 is appropriately adjusted to set the pressure in the process chamber 101 to be within a range of, for example, 20 to 1,330 Pa. The supply flow rate of the TDEAHf gas controlled by the LMFC 295e is set to be within, for example, a range of 10 to 100 ccm. A duration for which the wafer 100 is exposed to the TDEAHf gas, i.e., a gas supply time (gas irradiation time), is set to be within, for example, a range of 0.01 to 300 seconds. In this case, the temperature of the heater 106 is set such that the temperature of the wafer 100 falls within, for example, a range of 100 to 400° C., preferably 200 to 400° C., and more preferably 240 to 350° C. The flow rate of N₂ gas supplied as an inert gas at the same time with the TDEAHf gas is set to be within a range of, for example, 0 to 200 ccm. The TDEAHf gas supplied into the process chamber 101 reacts with at least a portion of the titanium-containing layer formed on the wafer 100 in step S105. Thus, a TiHfN layer containing titanium, hafnium, and nitrogen is formed. Specifically, chlorine (a halogen element) of the titanium-containing layer is removed due to a reaction of chlorine with an ethyl group contained in a ligand of an amino group contained in the TDEAHf gas, and hafnium contained in the TDEAHf gas and nitride are combined with titanium contained in the titanium-containing layer from which chlorine is removed, thereby forming a titanium hafnium nitride layer.

<Step S108>

In step S108, the valve 233e is closed to stop the supply of the TDEAHf gas into the process chamber 101. In this case, the inside of the process chamber 101 is vacuum-exhausted by the vacuum pump 164 while the APC valve 162 is open, thereby eliminating the TDEAHf gas, which does not react or has contributed to the formation of the layer containing aluminum and carbon, remaining in the process chamber 101 from the process chamber 101. Also, N₂ gas is continuously supplied as an inert gas into the process chamber 101 while the valve 233a or the valve 233g is open (or by opening the valve 233a or the valve 233g). The N₂ gas acts as a purge gas to increase the effect of eliminating the TDEAHf gas (that does not react or that has contributed to the formation of the HfN-containing layer) remaining in the process chamber 101 from the process chamber 101. The process chamber 101 may be purged by supplying the N₂ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, steps to be performed thereafter will not be badly influenced by the gas. In this case, the flow rate of the N₂ gas to be supplied into the process chamber 101 need not be high. For example, the inside of the process chamber 101 may be purged without causing the next step to be badly influenced by the gas by supplying an amount of a gas corresponding to the capacity of the process chamber 101. As described above, when the inside of the process chamber 101 is not completely purged, a purge time may be reduced to improve the throughput. Furthermore, the consumption of the $N_2$ gas may be suppressed to a necessary minimum level.

<Step S109>

By performing a cycle including the above-described steps S105 through S108 at least once [step S109], a composite metal nitride film containing titanium, hafnium, and nitrogen (i.e., TiHfN film) is formed. Also, the above-described cycle is preferably repeated a plurality of times. Thus, the TiHfN film is formed to a predetermined layer thickness on the high-k dielectric film formed on the wafer 100.

After forming the TiHfN film, the valve 233a of the inert gas supply pipe 232a or the valve 233g of the inert gas supply pipe 232g is opened to supply $N_2$ gas into the process chamber 101. The $N_2$ gas acts as a purge gas. Thus, the inside of the process chamber 101 is purged with an inert gas, thereby eliminating a gas remaining in the process chamber 101 from the inside of the process chamber 101. Afterwards, a second film-forming process is performed to form a TiN film as a cap film on the TiHfN film. The second film-forming process is performed in the process chamber 101 after the first film-forming process.

[Second Film-Forming Process (TiN Film-Forming Process)]

<Step S205>

In step S205, $TiCl_4$ (third source) is supplied into the process chamber 101. Specifically, the valves 233d and 293d of the gas supply pipe 232d are opened to supply $TiCl_4$ via the vaporizer 270d and the gas filter 281d into the gas supply pipe 232d. The flow rate of the $TiCl_4$ gas flowing in the gas supply pipe 232d is adjusted by the LMFC 295d. The $TiCl_4$ gas, the flow rate of which is adjusted, is supplied from the gas supply pipe 232d via the gas introduction port 110 onto the wafer 100 in the process chamber 101, and exhausted from the exhaust port 161. At the same time, the valve 272d is opened to supply $N_2$ gas as an inert gas into the inert gas supply pipe 271d. The flow rate of the $N_2$ gas flowing in the inert gas supply pipe 271d is adjusted by the MFC 273d. The $N_2$ gas, the flow rate of which is adjusted, is supplied into the process chamber 101 together with the $TiCl_4$ gas, and exhausted from the exhaust port 161. Also, the valve 233a may be opened to supply $N_2$ gas as an inert gas from the gas supply pipe 232a. The valve 233g may be opened to supply $N_2$ gas as an inert gas from the gas supply pipe 232g.

In this case, the APC valve 162 is appropriately adjusted to set the inside of the process chamber 101 to be within a range of, for example, 20 to 1,330 Pa. The supply flow rate of $TiCl_4$ gas controlled by the LMFC 295d is set to be within a range of, for example 10 to 100 ccm. A duration for which the wafer 100 is exposed to $TiCl_4$, i.e., a gas supply time (gas irradiation time), is set to be within a range of, for example, 0.01 to 300 seconds. In this case, the temperature of the heater 106 is set such that the temperature of the wafer 100 falls within, for example, a range of 100 to 400° C., preferably 200 to 400° C., and more preferably 240 to 350° C. The flow rate of $N_2$ gas supplied as an inert gas at the same time with the $TiCl_4$ gas is set to be within a range of, for example, 0 to 200 ccm. By supplying the $TiCl_4$ gas, for example, a titanium-containing layer having a thickness of less than one atomic layer to several atomic layers is formed on the TiHfN film formed in the first film-forming process.

<Step S206>

In step S206, the valve 233d is closed to stop the supply of the $TiCl_4$ into the process chamber 101. In this case, the inside of the process chamber 101 is vacuum-exhausted by the vacuum pump 164 while the APC valve 162 is open, thereby eliminating the $TiCl_4$ gas (that does not react or that has contributed to the formation of the titanium-containing layer) remaining in the process chamber 101 from the process chamber 101. In this case, $N_2$ gas is continuously supplied as an inert gas into the process chamber 101 while the valve 233a or the valve 233g is open (or by opening the valve 233a or the valve 233g). The $N_2$ gas acts as a purge gas to increase the effect of eliminating the $TiCl_4$ gas (that does not react or that has contributed to the formation of the titanium-containing layer) remaining in the process chamber 101 from the process chamber 101. The process chamber 101 may be purged by supplying the $N_2$ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, step S107 to be performed thereafter will not be badly influenced by the gas. In this case, the flow rate of the $N_2$ gas to be supplied into the process chamber 101 need not be high. For example, the inside of the process chamber 101 may be purged without causing step S107 to be badly influenced by the gas by supplying an amount of a gas corresponding to the capacity of the process chamber 101. As described above, when the inside of the process chamber 101 is not completely purged, a purge time may be reduced to improve the throughput. Furthermore, the consumption of the $N_2$ gas may be suppressed to a necessary minimum level.

<Step S207>

In step S207, $NH_3$ (fourth source) is supplied into the process chamber 101. Specifically, the valve 233b of the gas supply pipe 232b is opened to supply $NH_3$ gas into the gas supply pipe 232b. The flow rate of the $NH_3$ gas flowing in the gas supply pipe 232b is adjusted by the MFC 235b. The $NH_3$ gas, the flow rate of which is adjusted, is supplied from the gas supply pipe 232b via the gas introduction port 110 onto the wafer 100 in the process chamber 101, and exhausted from the exhaust port 161. Also, the valve 233a may be opened to supply $N_2$ gas as an inert gas from the gas supply pipe 232a. The valve 233g may be opened to supply $N_2$ gas as an inert gas from the gas supply pipe 232g.

In this case, the APC valve 162 is appropriately adjusted to set the inside of the process chamber 101 to be within a range of, for example, 20 to 1,330 Pa. The supply flow rate of the $NH_3$ gas controlled by the MFC 295b is set to be within, for example, a range of 10 to 200 sccm, and preferably a range of 100 to 200 sccm. A duration for which the wafer 100 is exposed to the $NH_3$ gas, i.e., a gas supply time (gas irradiation time), is set to be within, for example, a range of 0.01 to 300 seconds. In this case, the temperature of the heater 106 is set such that the temperature of the wafer 100 falls within, for example, a range of 100 to 400° C., preferably 200 to 400° C., and more preferably 240 to 350° C. The flow rate of $N_2$ gas supplied as an inert gas at the same time with the $TiCl_4$ gas is set to be within a range of, for example, 0 to 200 ccm. The $NH_3$ gas supplied into the process chamber 101 reacts with at least a portion of the titanium-containing layer formed on the wafer 100 in step S205. Thus, the titanium-containing layer is nitrided to form a titanium nitride layer.

<Step S208>

In step S208, the valve 233b is closed to stop the supply of the $NH_3$ gas into the process chamber 101. In this case, the inside of the process chamber 101 is vacuum-exhausted by the vacuum pump 164 while the APC valve 162 is open, thereby eliminating the $NH_3$ gas (that does not react or that has contributed to the formation of the nitrogen-containing layer) remaining in the process chamber 101 from the process chamber 101. In this case, $N_2$ gas is continuously supplied into the process chamber 101 while the valve 233a or the valve 233g is open (or by opening the valve 233a or the valve 233g). The $N_2$ gas acts as a purge gas to increase the effect of eliminating the $NH_3$ gas (that does not react or that has contributed to the formation of the nitrogen-containing layer) remaining in the process chamber 101 from the process chamber 101. The process chamber 101 may be purged by supplying the $N_2$ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, steps to be performed thereafter will not be badly influenced by the gas. In this case, the flow rate of the $N_2$ gas to be supplied into the process chamber 101 need not be high. For example, the inside of the process chamber 101 may be purged without causing the next step to be badly influenced by the gas by supplying an amount of a gas corresponding to the capacity of the process chamber 101. As described above, when the inside of the process chamber 101 is not completely purged, a purge time may be reduced to improve the throughput. Furthermore, the consumption of the $N_2$ gas may be suppressed to a necessary minimum level.

<Step S209>

By performing a cycle including the above-described steps S205 through S208 at least once [step S209], a metal nitride film containing titanium and nitrogen (i.e., a TiN film), may be formed. Also, the above-described cycle is preferably repeated a plurality of times. Thus, the TiN film is formed to a predetermined layer thickness (for example, a thickness of 4 nm) on the TiHfN film formed on the wafer 100.

After forming the TiN film, the valve 233a of the inert gas supply pipe 232a or the valve 233g of the inert gas supply pipe 232g is opened to supply $N_2$ gas into the process chamber 101. The $N_2$ gas acts as a purge gas. Thus, the inside of the process chamber 101 is purged with an inert gas, thereby eliminating a gas remaining in the process chamber 101 from the inside of the process chamber 101. Thereafter, an atmosphere in the process chamber 101 is replaced with the inert gas, and the pressure in the process chamber 101 is adjusted to a pressure of the transfer chamber 171.

<Step S210>

Thereafter, the support stage 103 is moved downward to open the gate valve 151, and the processed wafers 100 are unloaded by the transfer robot 173 to the process container 102 [step S112].

Figure 8:
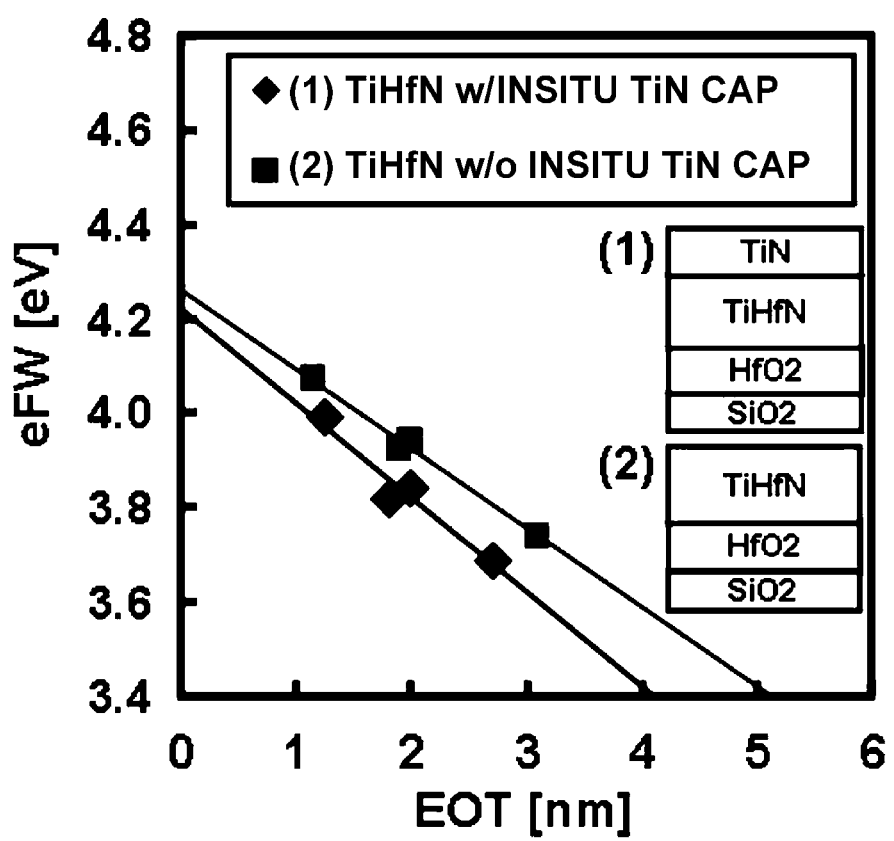
FIG. 8 is a diagram illustrating an effective work function (eWF) of a titanium hafnium nitride (TiHfN) film formed according to the above-described process flow shown in FIG. 6.

FIG. 8 is a diagram illustrating an example of an effective work function (eWF) of the titanium hafnium nitride (TiHfN) film formed in the above-described process flow. In FIG. 8, (1) illustrates the eWF of the titanium hafnium nitride film when formation of a cap film is performed in situ, and (2) illustrates the eWF of the titanium hafnium nitride film when the formation of the cap film is not performed in situ. eWF shown in FIG. 8 is a value which was obtained when $HfO_2$ was used as a high-k dielectric film and includes eWF of a dipole of a $HfO_2/SiO_2$ interface. Also, a process temperature (film-forming temperature) when eWF shown in FIG. 8 was obtained was 330° C., a supply time of $TiCl_4$ per cycle was 2 seconds, and a supply time of TDEAHf was 10 seconds. Referring to FIG. 8, it can be inferred that eWF of the titanium hafnium nitride film when $HfO_2$ was used as the high-k dielectric film was about 4.22 eV when a cap film was formed as in case (1), and was about 4.25 eV when the cap film was formed as in case (2). Although a small work function of less than 4.5 eV is required for an NMOS-type transistor, it can be seen that the titanium hafnium nitride film has a work function that meets the requirement.

The eWF of the titanium hafnium nitride film may be adjusted by a composition ratio of a metal element contained in the titanium hafnium nitride film. Specifically, a composition ratio of a metal element may be adjusted by adjusting a process temperature (film-forming temperature) and a gas supply time using a chemical vapor deposition (CVD) reaction of $TiCl_4$ which is a source of the titanium hafnium nitride film with TDEAHf. Also, the CVD reaction includes a vapor reaction and a surface reaction. Hereinafter, adjustment of the composition ratio of the metal element contained in the titanium hafnium nitride film will be described.

Figure 9A:
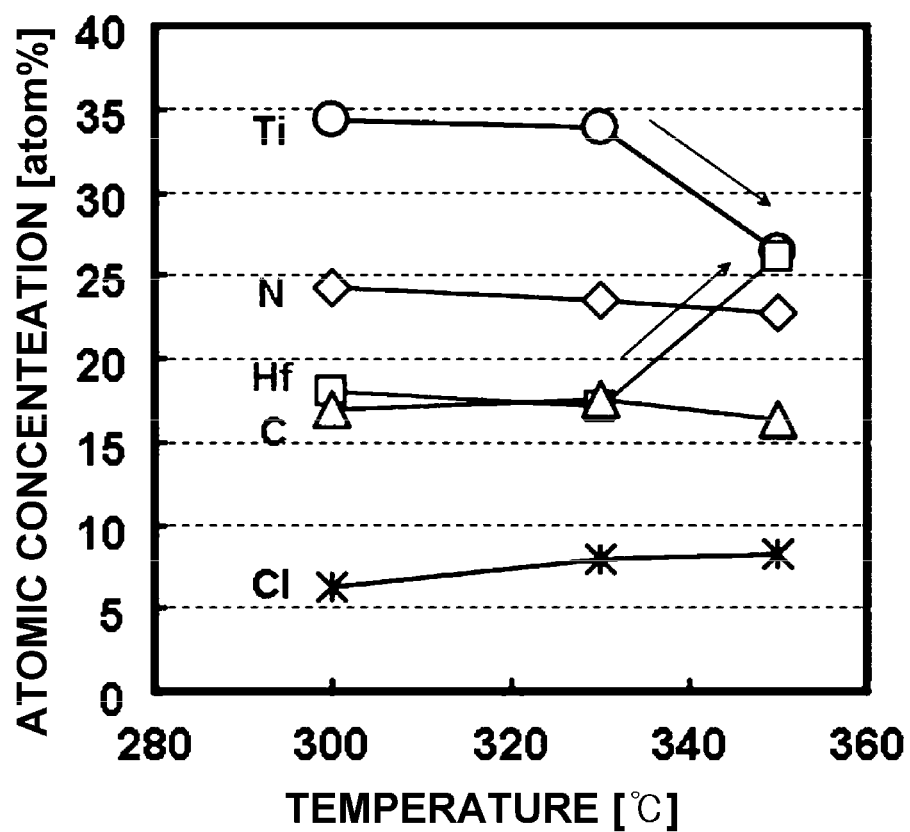
FIG. 9A illustrates a relationship between a process temperature (film-forming temperature) and a composition ratio when the titanium hafnium nitride film is formed.

FIG. 9A illustrates a relationship between a process temperature (film-forming temperature) and a composition ratio when the titanium hafnium nitride film is formed. FIG. 9B illustrates a composition ratio relative to a predetermined process temperature (film-forming temperature) when the titanium hafnium nitride film is formed. As shown in FIGS. 9A and 9B, composition ratio of titanium and hafnium are varied according to a process temperature. Specifically, as the process temperature increases, the content of titanium decreases, and the content of hafnium increases. In this case, composition ratio of other elements (carbon, nitrogen, and chlorine) remaining in the titanium hafnium nitride film are changed almost constantly. Titanium has a larger work function than hafnium. Thus, it may be inferred that as the process temperature increases, the work function of the titanium hafnium nitride film decreases.

As shown in FIG. 9A, when a process temperature ranges from 330 to 350° C., variations in composition ratio of titanium and hafnium become much larger than variations in composition ratio of other elements. Accordingly, when the work function of the titanium hafnium nitride film is adjusted, a film is preferably formed at a temperature ranging from 330 to 350° C.

Figure 10A:
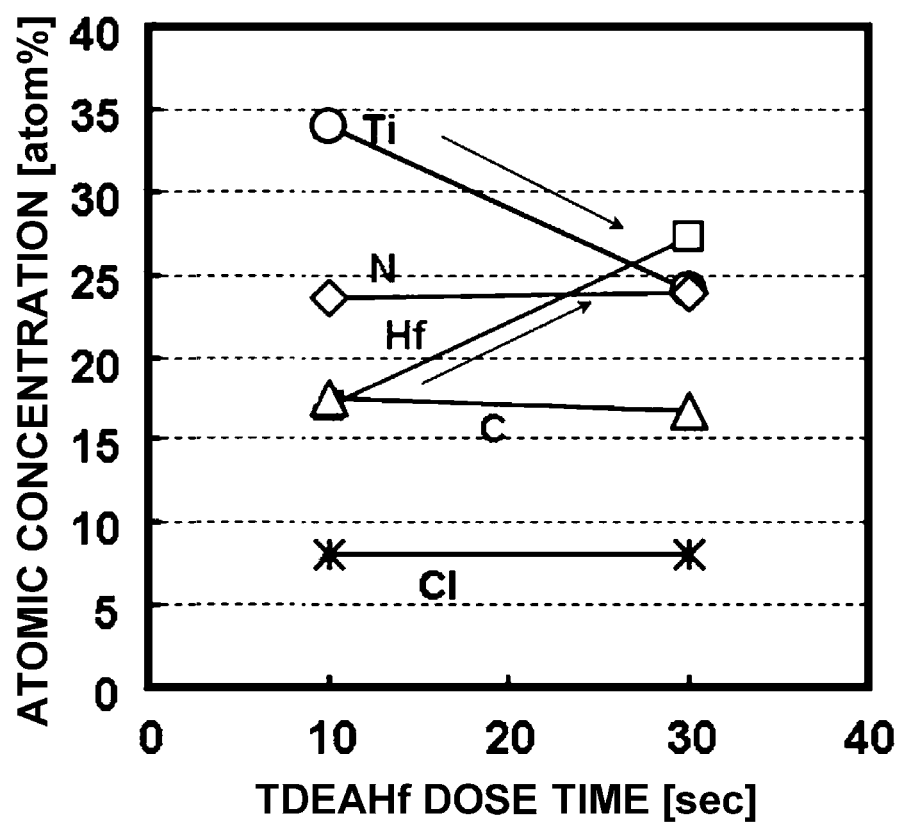
FIG. 10A illustrates a relationship between a supply time of TDEAHf per cycle and a composition ratio when the titanium hafnium nitride film is formed.

FIG. 10A illustrates a relationship between a supply time of TDEAHf per cycle and a composition ratio when the titanium hafnium nitride film is formed. FIG. 10B illustrates a relationship between a predetermined supply time of TDEAHf per cycle and a composition ratio when the titanium hafnium nitride film is formed. As shown in FIGS. 10A and 10B, composition ratio of titanium and hafnium vary according to the supply time of TDEAHf. Specifically, when the supply time ranges from 10 to 30 seconds, as the supply time increases, the content of titanium decreases, while the content of hafnium increases. Also, when the supply time ranges from 10 to 30 seconds, composition ratio of other elements (carbon, nitrogen, and chlorine) remaining in the titanium hafnium nitride film are changed almost constantly. Since titanium has a larger work function than hafnium as described above, when the supply time of TDEAHf ranges from 10 to 30 seconds, it may be inferred that as the supply time of TDEAHf increases, the work function of the titanium hafnium nitride film decreases. Also, when the composition ratios shown in FIG. 10B are obtained, the supply time of $TiCl_4$ per cycle is 2 seconds.

In addition, when the supply time ranges from 10 to 30 seconds, composition ratio of other elements (carbon, nitrogen, and chlorine) remaining in the titanium hafnium nitride film are changed almost constantly. Thus, when the work function of the titanium hafnium nitride film is adjusted, the supply time of TDEAHf is preferably adjusted in the range of 10 to 30 seconds.

According to the present embodiment, by alternately supplying a first source containing a first metal element and a halogen element and a second source containing a second metal element different from the first metal element and an amino group, a metal nitride film (composite metal nitride film), a work function of which may be adjusted, may be obtained. Integration problems (processibility, thermal stability, and diffusion stability) occur when adopting a new material for a conventional production line. However, since a film-forming process according to the present embodiment is based on a process of forming a titanium nitride film as a conventional metal nitride film, the integration problems may be avoided. Since a titanium nitride film has been formed as a cap film on the titanium hafnium nitride film in situ, oxidation resistance of the titanium hafnium nitride film may be improved, and a rise in work function due to oxidation may be prevented.

[Second Embodiment]

Figure 11:
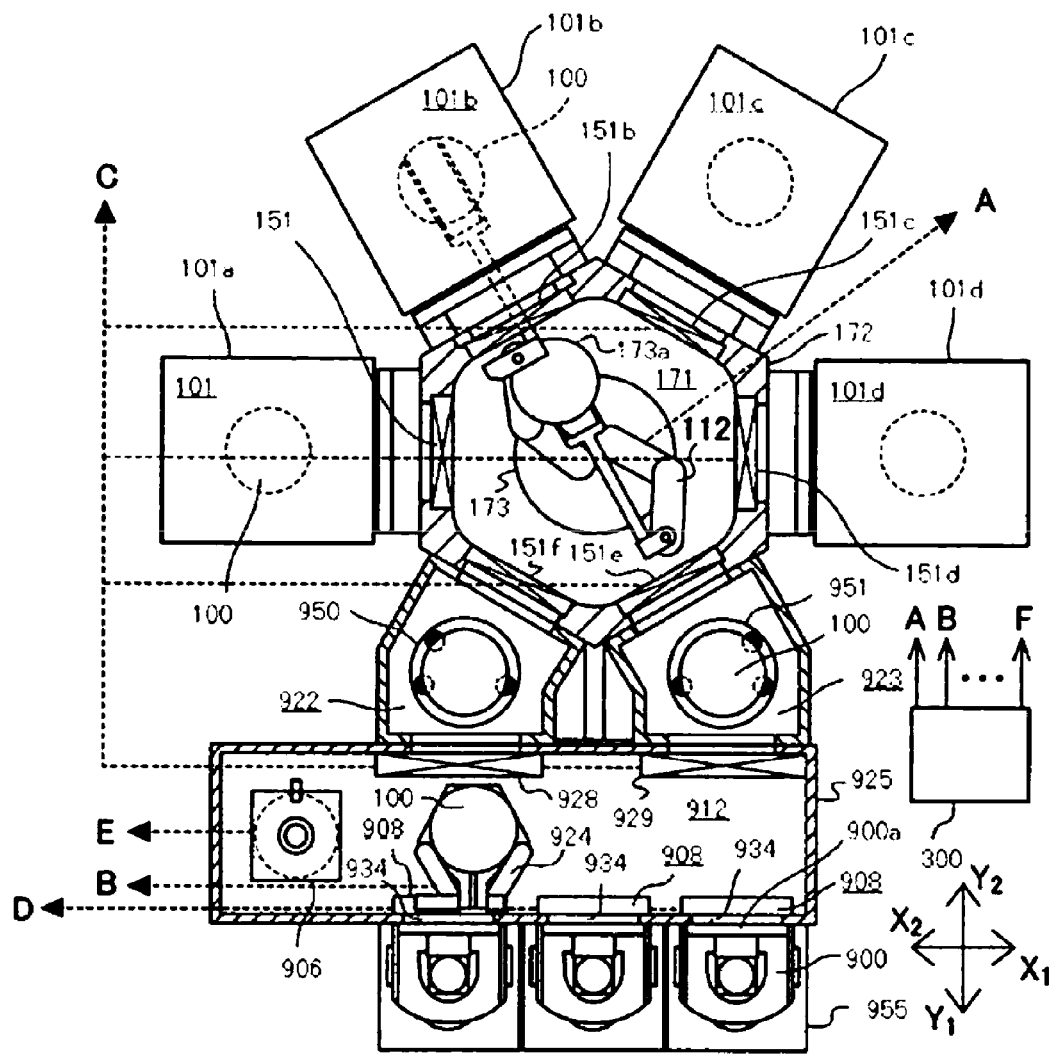
FIG. 11 is a cross-sectional view of an example of a configuration of a substrate processing apparatus according to a second exemplary embodiment of the present invention.

Hereinafter, a second embodiment will be described with reference to FIGS. 11, 12, and 13. FIG. 11 is a diagram illustrating a structure of a substrate processing apparatus according to the present embodiment. Although the above-described first embodiment has been described as an example in which a first film-forming process and a second film-forming process are continuously performed on a wafer 100 in a process chamber 101 [process container 102], the present invention is not limited thereto. As shown in FIG. 11, a plurality of process containers (process chambers) may be connected to a transfer container 172, and the first film-forming process and the second film-forming process may be performed in respectively different process containers. This will be described in detail below.

[Transfer Chamber]

Figure 12:
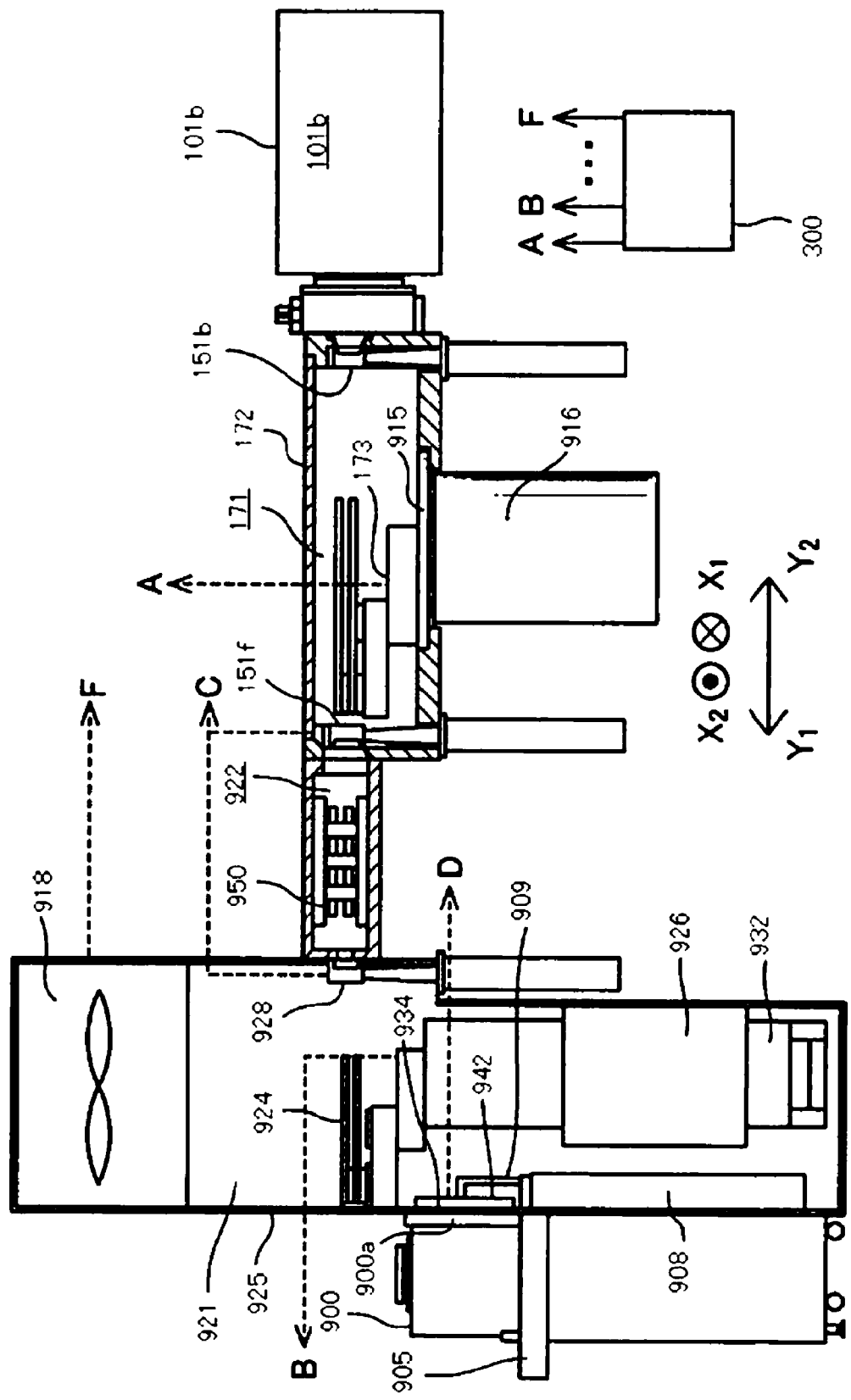
FIG. 12 is a longitudinal sectional view of the example of the configuration of the substrate processing apparatus according to the second exemplary embodiment of the present invention.

As shown in FIGS. 11 and 12, a transfer container 171 has a polygonal shape from a plan view. Preliminary chambers 922 and 923 and a first process module (PM, process chamber) 101a, a second PM 101b, a third PM 101c, and a fourth PM 101d are respectively connected to the transfer container 171 via gates valves 151, 151b, 151c, and 151d. Each of the first, second, third, and fourth PMs 101a, 101b, 101c, and 101d functions as a process chamber. A transfer robot 173 for carrying (transferring) the wafer 100 under a sub-atmospheric pressure is installed using a flange 915 as a base portion in a central portion of the transfer chamber 171. A robot rotation unit 916 is connected to the transfer robot 173 so that the transfer robot 173 can rotate.

[Preliminary Chamber]

A preliminary chamber 922 (loadlock module) for loading the wafer 100 and a preliminary chamber 923 (loadlock module) for unloading the wafer 100 are respectively connected via gate valves 151f and 151e to a wall side of the transfer container 172 to which the PM is not connected. Each of the preliminary chambers 922 and 923 is configured to be capable of resisting a sub-atmospheric pressure. Also, a substrate placing stage 950 for loading the wafer 100 is installed in the preliminary chamber 922, and a substrate placing stage 951 for unloading the wafer 100 is installed in the preliminary chamber 923. Thus, the substrate placing stages 950 are configured to retain the loaded/unloaded wafer 100 in the preliminary chambers 922 and 923.

[Standby Transfer Chamber I/O Stage]

A standby transfer chamber 921 (front end module) is connected to front sides of the preliminary chamber 922 and the preliminary chamber 923 via gate valves 928 and 929. The standby transfer chamber 921 is used under atmospheric pressure.

An atmospheric transfer robot 924 for carrying the wafer 100 is installed in the atmospheric transfer chamber 921. As shown in FIG. 12, the atmospheric transfer robot 924 is configured to be capable of moving upward/downward due to an elevator 926 installed in the atmospheric transfer chamber 921 and also to be capable of reciprocating in X1 and X2 directions due to a linear actuator 832.

As shown in FIG. 12, a clean unit 918 for supplying the clean air is installed on the atmospheric transfer chamber 921. As shown in FIG. 11, a device 906 (hereinafter referred to as a pre-aligner) for aligning a direction of a notch or an orientation flat formed in the wafer 100 is installed in the X2 direction of the atmospheric transfer chamber 921.

As shown in FIGS. 11 and 12, a substrate loading/unloading port 934 and a pod opener 908 are installed in a side of a Y1 direction of a housing 925 of the atmospheric transfer chamber 921 to load/unload the wafer 100 into/from the atmospheric transfer chamber 921. An I/O stage 905 (load port) is installed on the opposite side to the pod opener 908, that is, outside the housing 925, via the substrate loading/unloading port 934.

The pod opener 908 includes a closer 942 capable of opening/closing a cap 900a of a pod 900 and blocking the substrate loading/unloading port 934 and a driving mechanism 909 configured to drive the closer 942. The pod opener 908 opens/closes the cap 900a of the pod 900 placed on the I/O stage 905 to open/close a substrate door so that the wafers 100 can be loaded into/unloaded out of the pod 900.

[Process Module PM]

The gas supply pipe 232a, the gas supply pipe 232d, and the gas supply pipe 232d shown in FIG. 2 are connected to the first and third PMs installed in the transfer container 172, and the first and third PMs are configured to perform the above-described first film-forming process on the wafers 100. The gas supply pipe 232g, the gas supply pipe 232d, and the gas supply pipe 232b shown in FIG. 2 are connected to the second and fourth PMs, and the second and fourth PMs are configured to perform the above-described second film-forming process.

[Substrate Processing Process]

Figure 13:
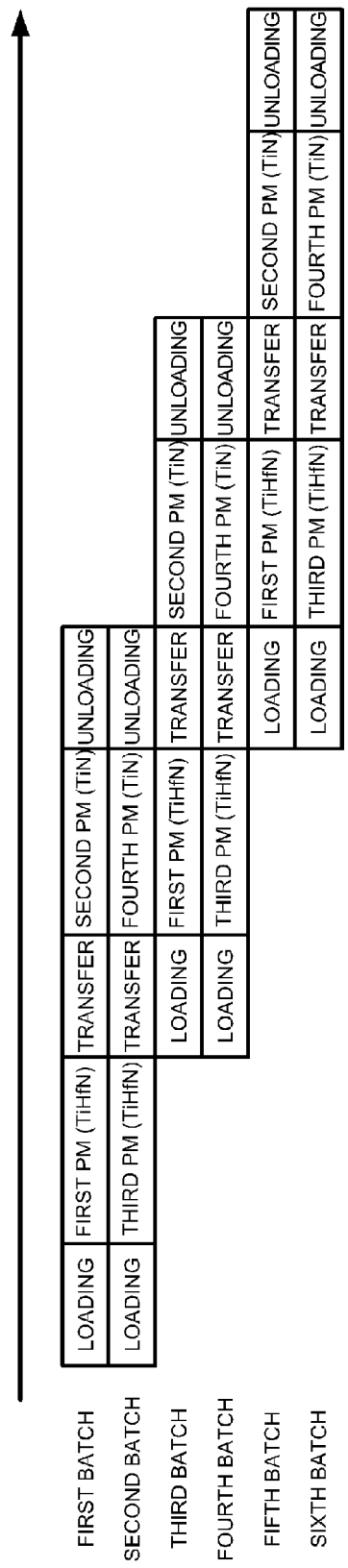
FIG. 13 is a diagram illustrating a transfer sequence of a substrate according to the second exemplary embodiment of the present invention.

As shown in FIG. 13, during the processing (first batch) of a first wafer 100, the first wafer 100 is transferred from the preliminary chamber 922 to the first PM, and a first film-forming process is performed in the first PM. When the first film-forming process ends, the first wafer 100 is transferred to the second PM to perform a second film-forming process, transferred to the preliminary chamber 923, and unloaded to the standby transfer chamber. During the processing (second batch) of a second wafer, the second wafer is transferred from the preliminary chamber 922 to the third PM, and a first film-forming process is performed in the third PM. When the first film-forming process ends in the third PM, the second wafer is transferred to a fourth PM to perform a second film-forming process. When the second film-forming process ends in the fourth PM, the second wafer is transferred from the fourth PM to the preliminary chamber 923 and unloaded to the standby transfer chamber. Similar to the first batch, during the processing (third batch) of a third wafer, the third wafer is sequentially transferred to the first and second PMs to perform a first film-forming process and a second film-forming process. Similar to the second batch, during the processing (fourth batch) of a fourth wafer, the fourth wafer is sequentially transferred to the third and fourth PMs to perform a first film-forming process and a second film-forming process. As described above, an odd batch is sequentially transferred to the first and second PMs to perform processing processes, while an even batch is sequentially transferred to the third and fourth PMs to perform processing processes. By performing the first film-forming process and the second film-forming process in respectively different process chambers, a gas used in the first film-forming process may be mixed with a gas used in the second film-forming process to reduce a possibility of generating by-products. Also, even if the first film-forming process and the second film-forming process are performed by changing a temperature of the wafer 100 or a pressure in the process atmosphere, change of temperatures or atmospheres may be accelerated to improve processing throughput. Although the present embodiment has been described as an example in which four process chambers are installed, the present invention is not limited thereto. The number of angles of a polygonal transfer container may be increased and five or more process chambers may be installed. Alternately, a plurality of process chambers may be installed on one side of a polygonal transfer container.

[Third Embodiment]

Figure 14:
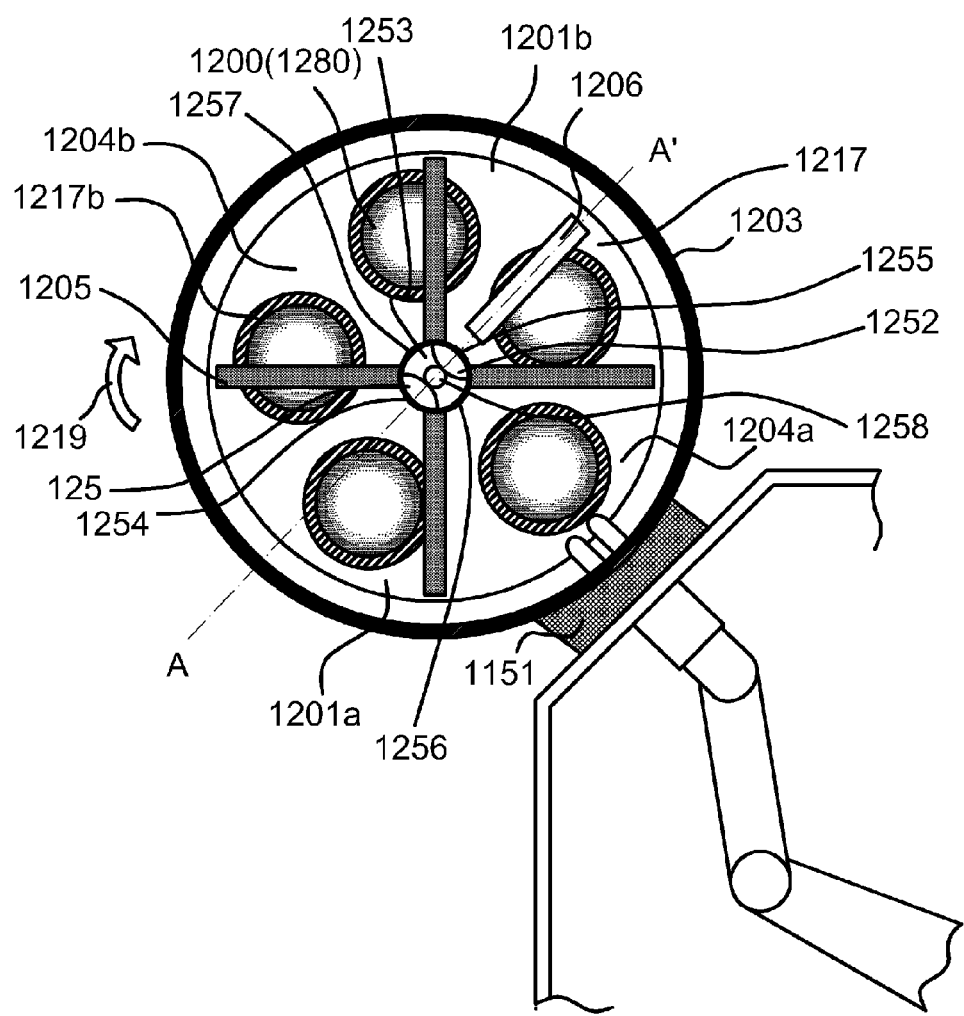
FIG. 14 is a cross-sectional view of an example of a configuration of a substrate process chamber according to a third exemplary embodiment of the present invention.
Figure 15:
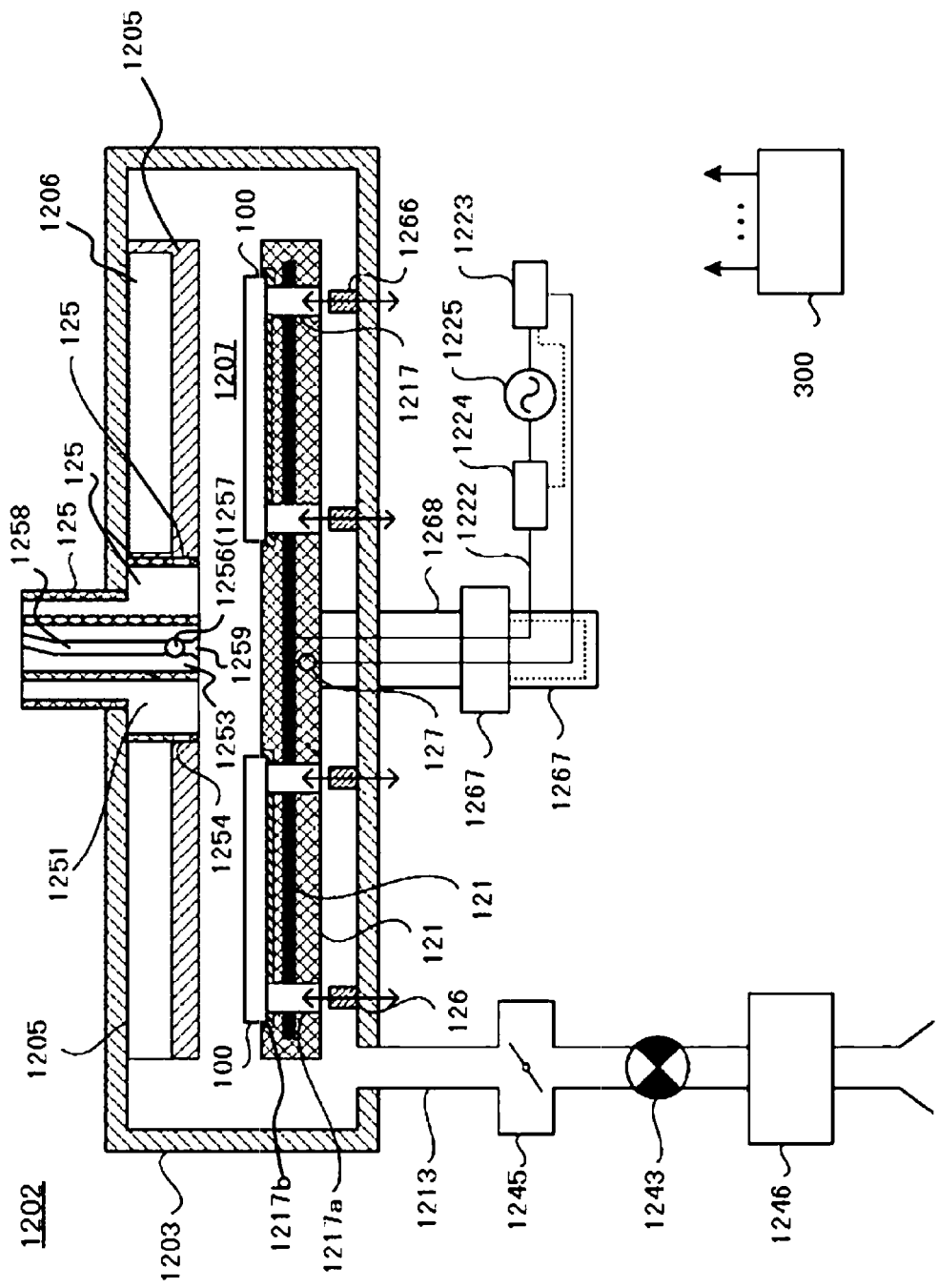
FIG. 15 is a longitudinal sectional view of the example of the configuration of the substrate process chamber according to the third exemplary embodiment of the present invention.

Hereinafter, a third embodiment will be described with reference to FIGS. 14 and 15. In the present embodiment, as shown in FIG. 14, a plurality of wafers 100 are contained in a process chamber divided into a plurality of sections. A structure of a process chamber 1202 which is a process furnace according to the present embodiment will be mainly described with reference to FIGS. 14 and 15. FIG. 14 is a schematic cross-sectional view of a process furnace according to the present embodiment. FIG. 15 is a schematic longitudinal sectional view of the process furnace according to the present embodiment, which is taken along line A-A' of the process furnace shown in FIG. 14.

[Reaction Container]

As shown in FIGS. 14 and 15, a process chamber 1202 which is a process furnace includes a reaction container 1203 which is a cylindrical air-tight container. A process space 1207 (process chamber) of a substrate 100 is formed in the reaction container 1203. Four boundary plates 1205 are installed above the process space 1207 in the reaction container 1203 and extend in a radial shape from a central portion of the process space 1207. The four boundary plates 1205 are configured to divide the process space 1207 into a first process region 1201a, a first purge region 1204a, a second process region 1201b, and a second purge region 1204b. Also, the first process region 1201a, the first purge region 1204a, the second process region 1201b, and the second purge region 1204b are sequentially arranged in a direction in which a susceptor 1217(substrate placing stage) to be described later rotates.

By rotating the susceptor 1217, the substrate 1200 placed on the susceptor 1217 is sequentially moved to the first process region 1201a, the first purge region 1204a, the second process region 1201b, and the second purge region 1204b. A first process gas is supplied into the first process region 1201a, a second process gas is supplied into the second process region 1201b, and an inert gas is supplied into the first purge region 1204a and the second purge region 1204b. Thus, by rotating the susceptor 1217, the first process gas, the inert gas, the second process gas, and inert gas are sequentially supplied onto the substrate 100.

A gap having a predetermined width is installed between an end portion of the boundary plate 1205 and a sidewall of the reaction container 1203 and configured to allow gases to pass therethrough. By jetting an inert gas from the inside of the first purge region 1204a and the inside of the second purge region 1204b toward the inside of the first process region 1201a and the inside of the second process region 1201b via the gap, intrusion of process gases into the first purge region 1204a and the second purge region 1204b may be inhibited, and a reaction of the process gases may be prevented.

Although each of angles between the boundary plates 1205 is set to be 90° C. in the present embodiment, the present invention is limited thereto. That is, each of the angles between the boundary plates 1205 may be appropriately changed in consideration of durations for which various gases are supplied to the substrate 100. For example, an angle between two boundary plates 1205 forming the second process region 1201b may be increased.

In addition, although each of the process regions 1201a and 1201b has been divided into the boundary plates 1205, the present invention is not limited thereto, and each of the process regions 1201a and 1201b may be configured not to mix gases supplied to the respective process regions 1201a and 1201b.

[Susceptor]

As shown in FIGS. 14 and 15, a susceptor 1217 which is a substrate support unit is installed below the boundary plate 1205, that is, in the center of a bottom portion of the reaction container 1203. A center of a rotation axis of the susceptor 1217 is disposed in the center of the reaction container 1203, and the susceptor 1217 is configured to be capable of rotating. The susceptor 1217 is formed of a non-metal material, for example, aluminum nitride (AlN), ceramics, quartz, etc. to reduce contamination of the substrate 1200 with metals. Also, the susceptor 1217 is electrically insulated from the reaction container 1203.

The susceptor 1217 is configured to support a plurality of substrates 100 (for example, five substrates 100 in the present embodiment) arranged on the same plane surface or the same circumference in the reaction container 1203. Here, the same plane surface is not limited to the completely same plane. When the susceptor 1217 is seen from a top view, a plurality of substrates 100 may be arranged not to overlap one another as shown in FIGS. 13 and 14.

Substrate placing portions 1217b are installed in a concentric circular shape in a support position of the substrate 100 on the surface of the susceptor 1217 to correspond to the number of substrates 100 to be processed. For example, each of the substrate placing portions 1217b may have a circular shape from a top view and have a concave shape from a side view. In this case, each of the substrate placing portions 1217b is preferably configured to have a diameter slightly larger than the diameter of the substrate 100. By placing the substrate 100 in the corresponding one of the substrate placing portions 1217b, determination of a position of the substrate 100 may be easily performed. Positional deviation may be prevented from occurring due to a case in which the substrate 100 protrudes from the susceptor 1217 due to centrifugal force caused by the rotation of the susceptor 1217.

As shown in FIG. 15, an elevating mechanism 1268 for moving the susceptor 1217 upward/downward is installed at the susceptor 1217. A plurality of through holes 1217a are installed in the susceptor 1217. A plurality of substrate elevating pins 1266 are installed on a bottom surface of the above-described reaction container 1203 to move the substrate 100 upward/downward and support the rear surface of the substrate 100 during the loading/unloading of the substrate 100 into/from the reaction container 1203. When the substrate elevating pins 1266 are moved upward or moved downward by the elevating mechanism 1268, the through holes 1217a and the substrate elevating pins 1266 are disposed to pass through the through holes 1217a while the substrate elevating pins 1266 are not in contact with the susceptor 1217.

A rotating mechanism 1267 is installed at the elevating mechanism 1268 to rotate the susceptor 1217. A rotation axis (not shown) of the rotating mechanism 1267 is connected to the susceptor 1217. The rotating mechanism 1267 is operated to rotate the susceptor 1217. A control unit 300 is connected to the rotating mechanism 1267 via a coupling unit 1267a. The coupling unit 1267a is configured as a slip ring mechanism in which a rotation side and a fixing side are electrically connected by a metal brush or the like. Thus, rotation of the susceptor 1217 is not hindered. The control unit 300 is configured to control an amount of current supplied to the rotating mechanism 1267 so that the susceptor 1217 can rotate at predetermined speed for a predetermined time. As described above, by rotating the susceptor 1217, the substrate 100 placed on the susceptor 1217 is sequentially moved to the first process region 1201a, the first purge region 1204a, the second process region 1201b, and the second purge region 1204b.

[Heating Unit]

A heater 1218 which is a heating unit is integrally buried in the susceptor 1217 and configured to heat the substrate 100. When power is supplied to the heater 1218, the surface of the substrate 100 is heated to a predetermined temperature (for example, room temperature to a temperature of about 1,000° C.). Also, a plurality of heaters 1218 (for example, five heaters) may be installed on the same plane to individually heat the respective substrates 100 placed on the susceptor 1217.

A temperature sensor 1274 is installed at the susceptor 1217. A temperature adjustor 1223, a power adjustor 1224, and a heater power source 1225 are electrically connected to the heater 1218 and the temperature sensor 1274 via a power supply line 1222. An amount of current supplied to the heater 1218 is controlled based on temperature information detected by the temperature sensor 1274.

[Gas Supply Unit]

A gas supply unit 1250 including a first process gas introduction unit 1251, a second process gas introduction unit 1252, an inert gas introduction unit 1253, and a cleaning gas introduction unit 1258 may be installed above the reaction container 1203. The gas supply unit 1250 may be air-tightly installed at an opening formed at an upper side of the reaction container 1203. A first gas jet port 1254 is installed in a sidewall of the first process gas introduction unit 1251. A second gas jet port 1255 is installed in a sidewall of the second process gas introduction unit 1252. A first inert gas jet port 1256 and a second inert gas jet port 1257 are installed in a sidewall of the inert gas introduction unit 1253 opposite each other. A cleaning gas supply hole 1259 which is an end portion of the cleaning gas introduction unit 1258 is installed in a bottom surface of the gas supply unit 1250. That is, the cleaning gas supply hole 1259 is installed at a lower level than the first gas jet port 1254, the second gas jet port 1255, and the inert gas jet ports 1256 and 1257.

The gas supply unit 1250 is configured to supply a first process gas from the first process gas introduction unit 1251 into the first process region 1201a, supply a second process gas from the second process gas introduction unit 1252 into the second process region 1201b, and supply an inert gas from the inert gas introduction unit 1253 into the first purge region 1204a and the second purge region 1204b. The gas supply unit 1250 may not mix respective process gases and the inert gas but individually supply the respective process gases and the inert gas into respective regions. Also, the gas supply unit 1250 may concurrently supply the respective process gases and the inert gas into the respective regions.

Here, $TiCl_4$ which is a first source described in the first embodiment is used as the first process gas, and TDEAHf which is a second source described in the first embodiment is used as the second process gas. Accordingly, a substrate is sequentially exposed to $TiCl_4$, an inert gas, TDEAHf, and the inert gas by rotating the susceptor 1217, and the first film-forming process according to the first embodiment may be performed. A composite metal nitride film may be formed by performing rotation of the susceptor 1217 a predetermined number of times. After the rotation of the susceptor 1217 the predetermined number of times, the susceptor 1217 may be rotated by supplying $TiCl_4$ into the first process region 1201a and supplying $NH_3$ gas into the second process region 1201b to sequentially expose the wafer 100 to $TiCl_4$, an inert gas, $NH_3$, and the inert gas, and the second film-forming process according to the first embodiment may be performed. Due to the structure described above, a process gas supply time and a purge time may be reduced to improve the process throughput. Also, the present embodiment has been described as an example in which gases supplied into the first process region 1201a and the second process region 1201b are switched between the first film-forming process and the second film-forming process, but the present invention is not limited thereto. As in the second embodiment, a plurality of process chambers 1202 may be installed, and respectively different processes may be performed in the respective process chambers 1202.

[Fourth Embodiment]

Figure 16:
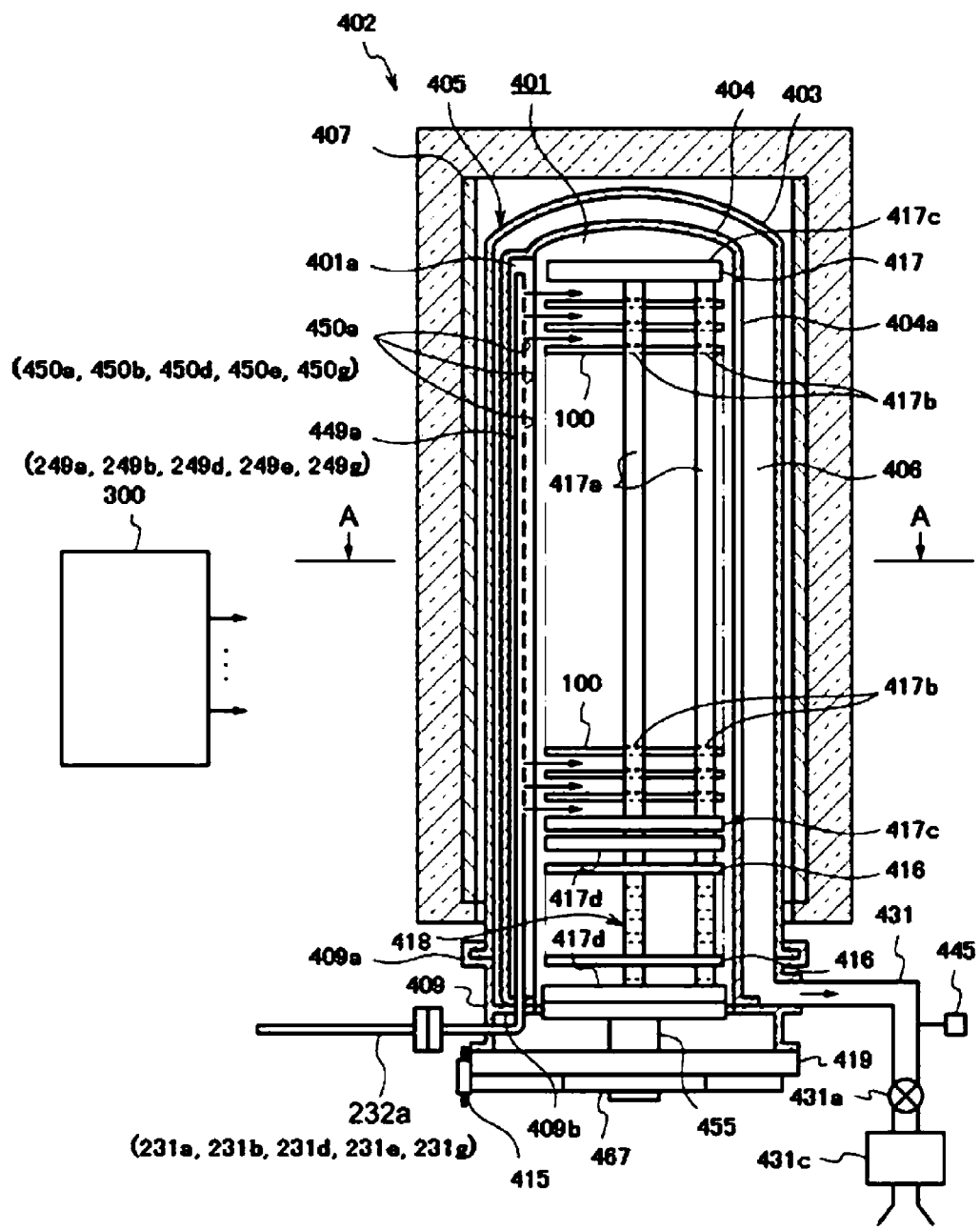
FIG. 16 is a longitudinal sectional view of an example of a configuration of a substrate process chamber according to a fourth exemplary embodiment of the present invention.
Figure 17:
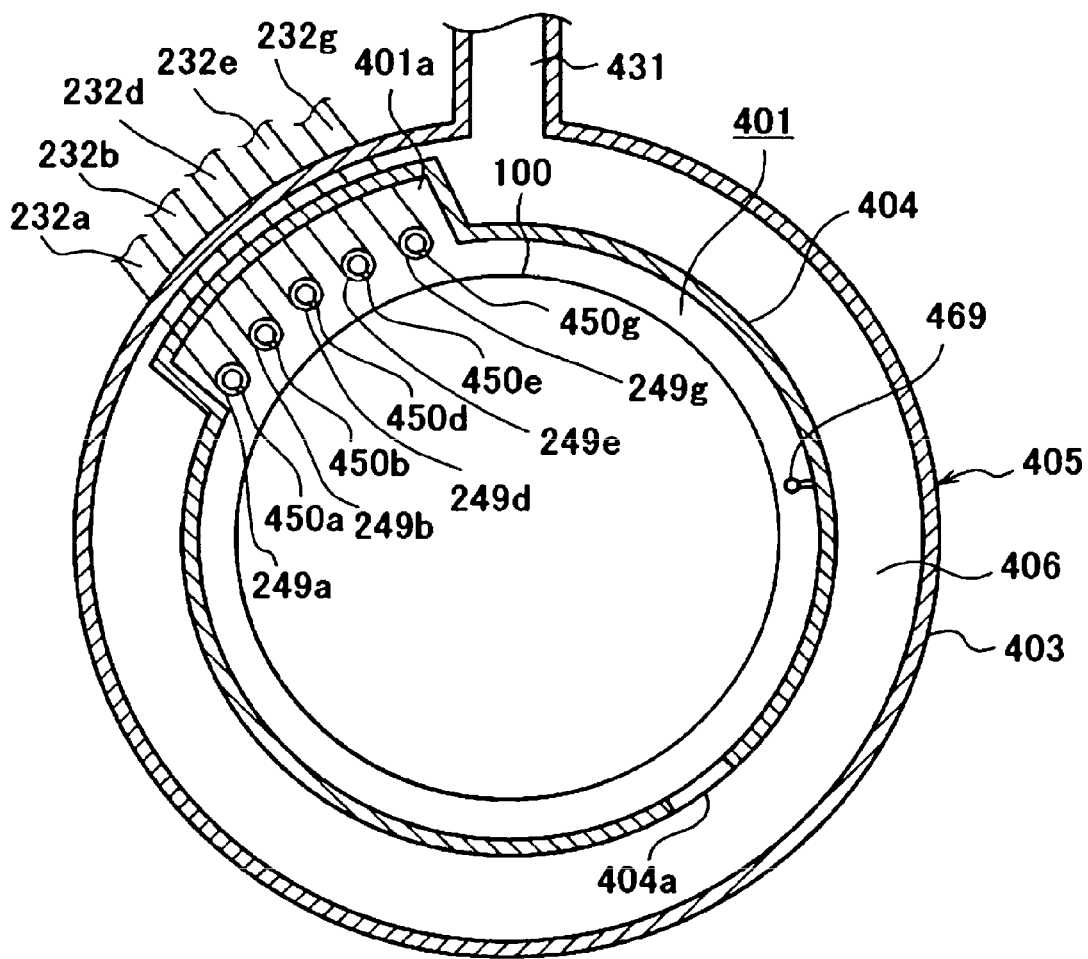
FIG. 17 is a cross-sectional view of the example of the configuration of the substrate process chamber according to the fourth exemplary embodiment of the present invention.

Hereinafter, a fourth embodiment will be described with reference to FIGS. 16 and 17. In the present embodiment, as shown in FIG. 16, the processing of a plurality of wafers 100 is performed while the wafers 100 are stacked.

[Process Chamber]

A process furnace 402 is disposed in a longitudinal direction such that a central line of the process furnace 402 is vertical. The process furnace 402 includes a longitudinal process tube 405 as a reaction tube fixedly supported by a housing (not shown). The process tube 405 includes an inner tube 404 and an outer tube 403. Each of the inner tube 404 and the outer tube 403 is formed in a single-bodied cylindrical shape using a high heat-resistant material, for example, quartz ($SiO_2$), silicon carbide (SiC), or a compound material thereof.

The inner tube 404 has a cylindrical shape, an upper end of which is closed and a lower end of which is open. A process chamber 401 is formed in the inner tube 404 and configured to accommodate wafers 100 such that the wafers 100 are stacked in a horizontal posture in multiple stages using a boat 417 which is a substrate retainer. A lower end opening of the inner tube 404 constitutes a furnace port through which the boat 417 configured to retain a group of wafers 100 is loaded/unloaded. Accordingly, an inner diameter of the inner tube 404 is set to be greater than the maximum outer diameter of the boat 417 configured to retain the group of wafers 100. A portion of the outer tube 403 has a circular concentric shape as the inner tube 404. The outer tube 403 has a greater inner diameter than the inner tube 404 and a cylindrical shape having a closed upper end and an open lower end. The outer tube 403 is coated to surround an outer side of the inner tube 404 in a circular concentric shape with the inner tube 404. A lower end portion of the outer tube 403 is installed on a flange 409a disposed on a manifold 409 via an O-ring (not shown), and air-tightly encapsulated by the O-ring. A lower end portion of the inner tube 404 is mounted on an inner circular ring portion 409b. The manifold 409 is installed to be capable of being attached to or detached from the inner tube 404 and the outer tube 403 to perform a maintenance operation or cleaning operation on the inner tube 404 and the outer tube 403. The manifold 409 is supported by a housing (not shown) so that the process tube 405 can be vertically installed. Hereinafter, in some cases, a space formed in the outer tube 405 may be referred to as the process chamber 401.

[Exhaust Unit]

An exhaust pipe 431 is connected to a portion of a sidewall of the manifold 409 to exhaust an atmosphere in the process chamber 401. An exhaust port for exhausting the atmosphere in the process chamber 401 is formed at a connection portion between the manifold 409 and the exhaust pipe 431. The inside of the exhaust pipe 431 is in communication with an exhaust path including a gap between the inner tube 404 and the outer tube 403 via the exhaust port. Also, a cross-sectional shape of the exhaust path is a roughly circular ring shape. Thus, the atmosphere in the process chamber 401 may be uniformly exhausted from an upper end of an exhaust hole 404a to be described later formed in the inner tube 404 to a lower end thereof. That is, the atmosphere may be uniformly exhausted from all of a plurality of wafers 100 placed in the boat 417. A pressure sensor 445, an APC valve 431a which is a pressure adjustor, and a vacuum pump 431c which is a vacuum exhaust device are sequentially installed at the exhaust pipe 431 from an upstream direction. The vacuum pump 431c is configured such that the inside of the process chamber 401 is vacuum-exhausted to have a desired pressure (degree of vacuum). A controller 300 is electrically connected to the APC valve 431a and the pressure sensor 445. The controller 300 is configured to control an opening rate of the APC valve 431a based on pressure detected by the pressure sensor 445 such that the inside of the process chamber 401 has a desired pressure at a desired timing. An exhaust unit (exhaust system) according to the present embodiment is mainly configured by the exhaust pipe 431, the pressure sensor 445, and the APC valve 431a. The exhaust unit may further include the vacuum pump 431c. Also, a trap apparatus configured to trap reaction by-products of an exhaust gas or unreacted source gases or a harm-removing apparatus for removing corrosive components or toxic components contained in the exhaust gas may be connected to the exhaust pipe 431. In this case, the exhaust unit may further include the trap apparatus or the harm-removing apparatus.

[Substrate Retainer]

A seal cap 419 for closing the lower end opening of the manifold 409 comes in contact with the manifold 409 from a lower side in a vertical direction. The seal cap 419 for blocking a lower end opening of the manifold 409 comes in contact with the manifold 409 from a lower side in a vertical direction. The seal cap 419 has a disk shape having an outer diameter equal to or greater than the outer diameter of the outer tube 403. The seal cap 419 is vertically moved in a horizontal posture by a boat elevator 415 to be described later vertically installed outside the process tube 405.

A boat 417 which is a substrate retaining member serving as a substrate retaining means (substrate retainer) for retaining the wafer 400 is vertically erected and supported on the seal cap 419. The boat 417 includes a pair of upper and lower end plates 417c and a plurality of retaining members 417a vertically installed between the end plates 417c. The end plates 417c and the retaining member 417a are formed of a heat-resistant material, for example, quartz (SiO$_2$), silicon carbide (SiC), or a compound material thereof. A plurality of retaining grooves 417b are installed in each of the retaining members 417a at regular intervals in a lengthwise direction. By respectively inserting circular peripheral edges of the wafers 100 into the retaining grooves 417b disposed in the same stage in the plurality of retaining members 417a, the plurality of wafers 100 are stacked and retained in a horizontal posture in multiple stages while centers thereof are adjusted.

A pair of upper and lower subsidiary end plates 417d are installed between the boat 417 and the seal cap 419 and supported by a plurality of subsidiary retaining members 418. A plurality of retaining grooves are installed in each of the subsidiary retaining members 418. A plurality of adiabatic plates 416, each of which has a disk shape formed of a heat-resistant material, for example, quartz (SiO$_2$) or silicon carbide (SiC), are loaded in a horizontal posture and in multiple stages in the retaining grooves. The adiabatic plates 416 are configured to prevent transmission of heat from a heater unit 407 which will be described below to a side of the manifold 409. Also, the adiabatic plates 416 are configured to inhibit a drop in temperature below the plurality of wafers 100 placed in the boat 417.

A rotating mechanism 467 that rotates the boat 417 is installed at a side of the seal cap 419 opposite to the process chamber 401. A rotation axis of the rotating mechanism 467 passes through the seal cap 419 and supports the boat 417 from below. The rotating mechanism 467 may rotate the wafer 100 in the process chamber 401 by rotating the rotation axis 455. The seal cap 419 is configured to be vertically moved by a boat elevator 415 which is a transfer means (transfer mechanism) so that the boat 417 can be loaded into/unloaded from the process chamber 401.

[Heater Unit]

A heater unit 407 which is a heating means (heating mechanism) is installed outside the outer tube 403 to surround the heater unit 407. The heater unit 407 heats the entire inside of the process tube 405 to have a uniform or predetermined temperature distribution. The heater unit 407 is supported by a housing (not shown) of the substrate processing apparatus and vertically installed. For example, the heater unit 407 is configured as a resistive heater, for example, a carbon heater or the like. A temperature sensor 469 which is a temperature detector is installed in the process tube 405. A heating unit (heating system) according to the present embodiment is mainly configured by the heater unit 407 and the temperature sensor 469.

[Gas Supply Unit]

A preliminary chamber 401a having a channel shape is formed in a sidewall of the inner tube 404 [in a position which is 180° opposite to an exhaust hole 404a which will be described below]. The preliminary chamber 401a protrudes outward in a radial direction of the inner tube 404 from the sidewall of the inner tube 404 and extends long in a vertical direction. A sidewall of the preliminary chamber 401a constitutes a portion of the sidewall of the inner tube 404. Also, an inner wall of the preliminary chamber 401a forms a portion of an inner wall of the process chamber 401. Nozzles 249a, 249b, 249d, 249e, and 249g for supplying gases into the process chamber 401 are installed in the preliminary chamber 401a. The nozzles 249a, 249b, 249d, 249e, and 249g for supplying gases into the process chamber 401 are installed in the preliminary chamber 401a, and extend along an inner wall of the preliminary chamber 401a [i.e., inner wall of the process chamber 401] from a lower portion of the inner wall of the preliminary chamber 401a to an upper portion thereof in a direction in which the wafers 100 are stacked. The nozzles 249a, 249b, 249d, 249e, and 249g are installed along a wafer arrangement region in which the wafers 100 are arranged, in a region horizontally surrounding the wafer arrangement region, beside the wafer arrangement region. The nozzles 249a, 249b, 249d, 249e, and 249g are configured as L-shaped long nozzles. A horizontal portion of each of the nozzles 249a, 249b, 249d, 249e, and 249g is installed through the manifold 409, and a vertical portion thereof is installed to rise at least from: one end side of the wafer arrangement region to the other end side thereof. Although one nozzle is illustrated in FIG. 16 for brevity, five nozzles 249a, 249b, 249d, 249e, and 249g are actually installed as shown in FIG. 17. A plurality of gas supply holes 450a, 450b, 450d, 450e, and 450g may be respectively installed in side surfaces of the nozzles 249a, 249b, 249d, 249e, and 249g. The gas supply holes 450a, 450b, 450d, 450e, and 450g are installed from a lower portion to an upper portion thereof to have the same opening area or gradually increasing opening areas at the same opening pitch.

End portions of horizontal portions of the nozzles 249a, 249b, 249d, 249e, and 249g formed through the manifold 409 are respectively connected to gas supply pipes 232a, 232b, 232d, 232e, and 232g (similar to those described with reference to FIG. 2), which are gas supply lines, outside the process tube 405. That is, an inert gas may be supplied from the nozzles 249a and 249g, $NH_3$ gas may be supplied as a fourth source gas from the nozzle 249b, $TiCl_4$ may be supplied as first and third sources from the nozzle 249d, and TDEAHf gas may be supplied as a second source from the nozzle 249e. Also, as shown in FIG. 17, the nozzles 249a and 249g are preferably disposed via other nozzles. Due to the above-described disposition, process uniformity of the wafer 100 may be improved.

A method of supplying gases according to the present embodiment includes transferring gases via the nozzles 249a, 249b, 249d, 249e, and 249g disposed in the preliminary chamber 401a and firstly jetting gases into the vicinity of the wafer 100 in the inner tube 404 from the gas supply holes 450a, 450b, 450d, 450e, and 450g respectively formed in the nozzles 249a, 249b, 249d, 249e, and 249g.

An exhaust hole 404a which is, for example, a slit-shaped through hole is installed to be thin and long in a vertical direction in the sidewall of the inner tube 404 opposite to the nozzles 249a, 249b, 249d, 249e, and 249g [i.e., in a position which is 180° opposite to the preliminary chamber 401a]. The process chamber 401 is in communication with an exhaust path 406 including a gap formed between the inner tube 404 and the outer tube 403 via the exhaust hole 404a. Accordingly, gases supplied from the gas supply holes 450a, 450b, 450d, 450e, and 450g of the nozzles 249a, 249b, 249d, 249e, and 249g into the process chamber 401 are supplied into the exhaust path 406 via the exhaust hole 404a, supplied into the exhaust pipe 431 via an exhaust port, and discharged out of the process furnace 402. In this case, the gases supplied from the gas supply ports 450a, 450b, 450d, 450e, and 450g into the vicinity of the wafer 100 in the process chamber 401 are supplied in a horizontal direction, that is, a direction parallel to the surface of the wafer 100, and supplied into the exhaust path 406 via the exhaust hole 404a. That is, a main flow of the gases in the process chamber 401 is in the horizontal direction, that is, the direction parallel to the surface of the wafer 100. Due to the above-described configuration, gases may be uniformly supplied onto the respective wafers 100 so that thicknesses of thin films formed on the respective wafers 100 can be uniformized. Furthermore, the exhaust hole 404a is not limited to including a slit-shaped through hole but may include a plurality of holes.

[Substrate Processing Process]

A substrate processing process is the same as in the process flow of the first embodiment. Initially, when a plurality of wafers 100 are charged in the boat 417 (wafer charging) [refer to step S101 in FIG. 6], as shown in FIG. 16, the boat 417 configured to support the plurality of wafers 100 are lifted by the boat elevator 415 and loaded into the process chamber 401 (boat loading) [refer to step S102 in FIG. 6]. In this state, the seal cap 419 air-tightly closes a bottom end of the manifold 409.

The inside of the process chamber 401 is vacuum-exhausted to have a desired pressure (degree of vacuum) by the vacuum pump 431c. In this case, the pressure in the process chamber 401 is measured by the pressure sensor 445, and the APC valve 431a is feedback-controlled based on the measured pressure (pressure control) [refer to step S103 in FIG. 6]. Also, the inside of the process chamber 401 is heated by the heater unit 407 to have a desired temperature. In this case, an amount of current supplied to the heater unit 407 is feedback-controlled based on temperature information detected by the temperature sensor 469, so that the inside of the process chamber 401 may have a desired temperature distribution (temperature control) [refer to step S103 in FIG. 6]. Subsequently, the wafers 100 are rotated by rotating the boat 417 using the rotating mechanism 467.

The vacuum pump 431c is continuously operated at least until the processing of the wafers 100 is completed. The inside of the process chamber 401 is heated by the heater unit 407 to have a desired temperature. In this case, an amount of current supplied into the heater unit 407 is feedback-controlled based on temperature information detected by the temperature sensor 469 such that the inside of the process chamber 401 has a desired temperature distribution (temperature control). The heating of the inside of the process chamber 401 by the heater unit 407 is continuously performed at least until the processing of the wafers 100 is completed. Then, rotation of the boat 417 and the wafers 100 begins by the rotating mechanism 467. Also, the rotation of the boat 417 and the wafers 100 by the rotating mechanism 467 is continuously performed at least until the processing of the wafers 100 is completed.

Next, a first film-forming process of supplying $TiCl_4$ and TDEAHf into the process chamber 401 to form a TiHfN film as a composite metal nitride film and a second film-forming process of forming a TiN film as a metal nitride film (cap film) are sequentially performed. Since the first film process and the second film-forming process are the same as in the first embodiment, a description thereof is omitted.

[Fifth Embodiment]

Figure 18:
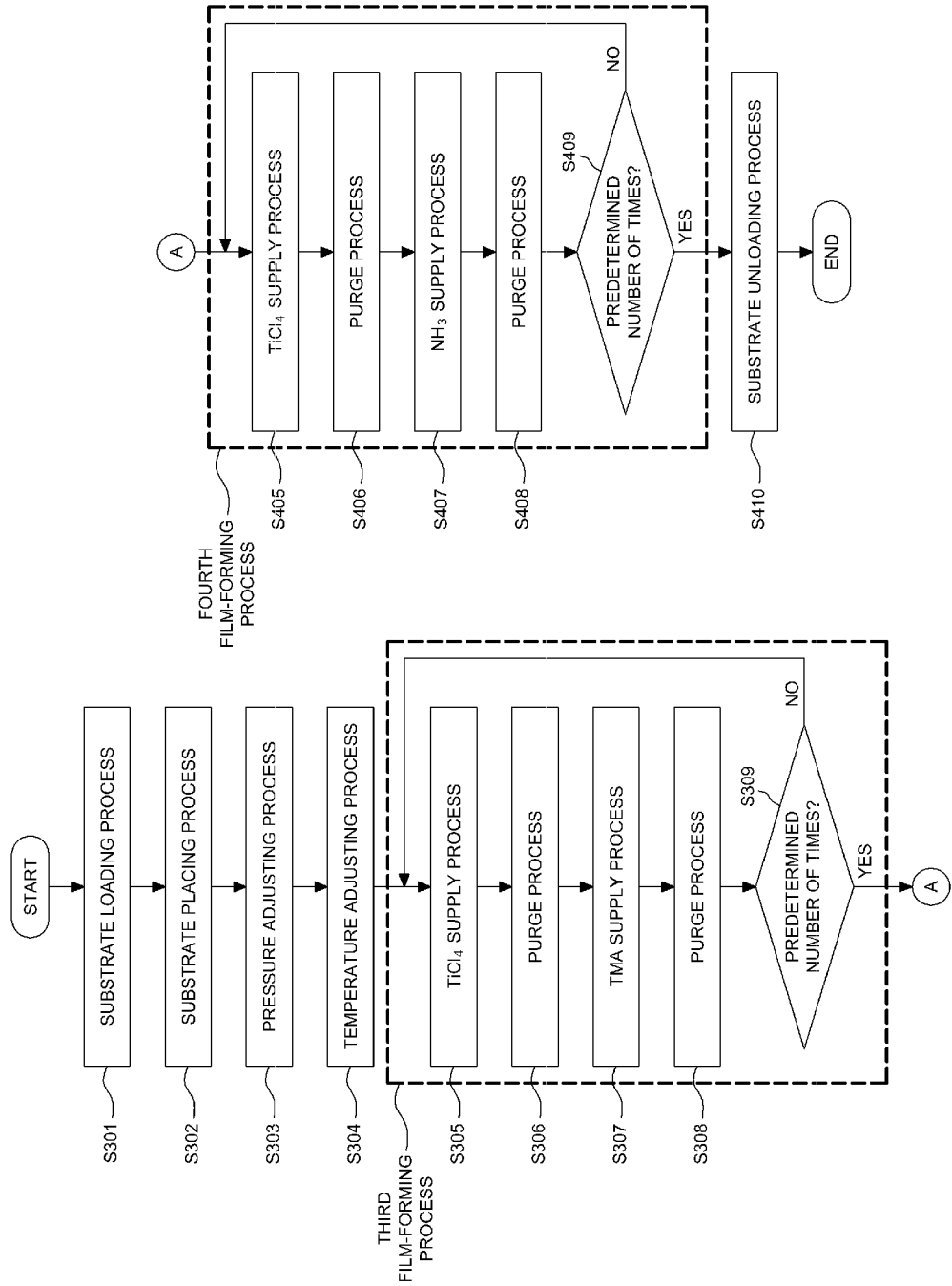
FIG. 18 is a process flowchart illustrating an example of a film-forming process in a process flow according to a fifth exemplary embodiment of the present invention.
Figure 19A:
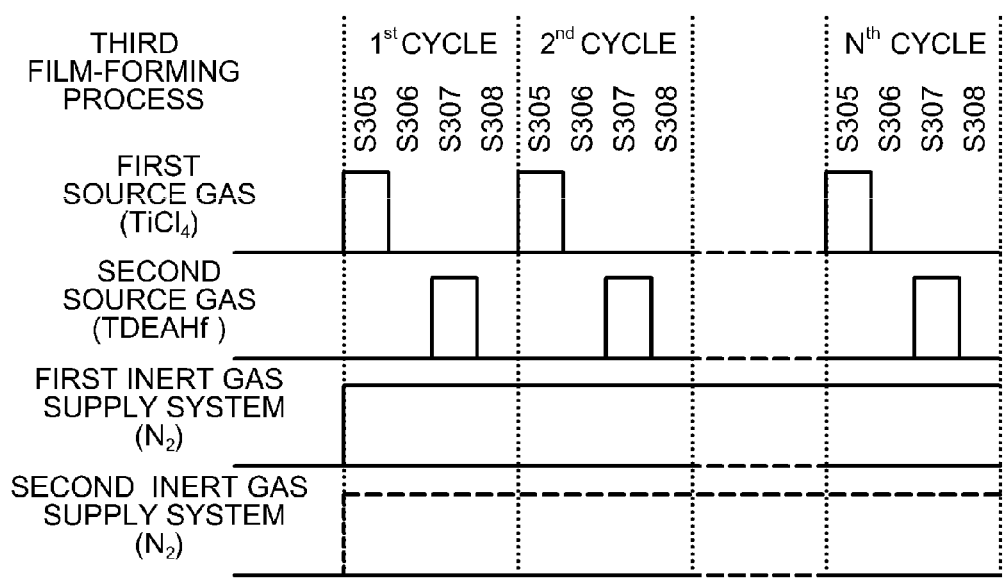
FIG. 19A is a diagram illustrating gas supply timing in the third film-forming process shown in FIG. 18.
Figure 19B:
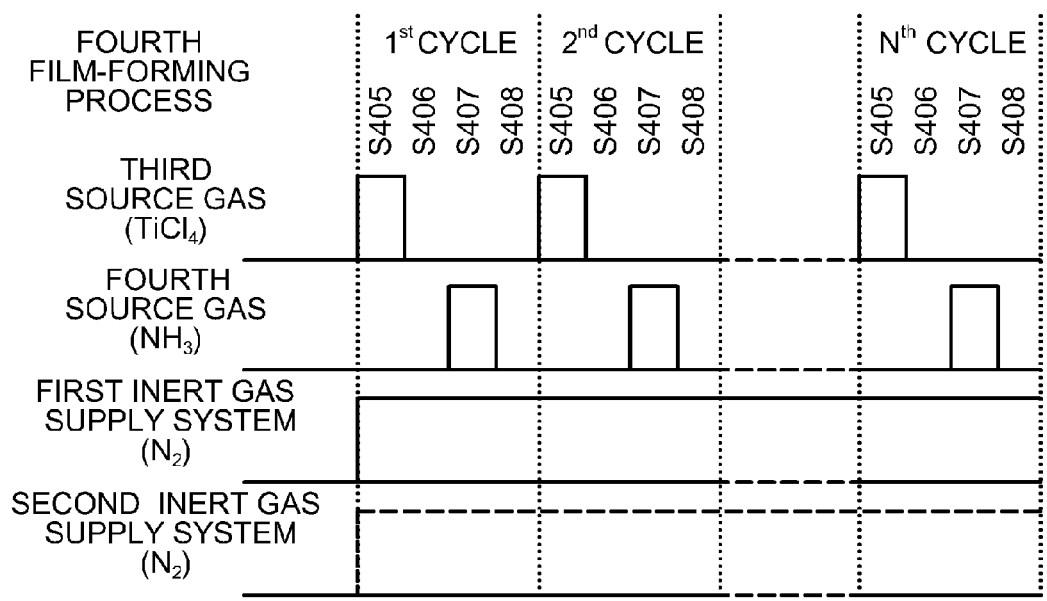
FIG. 19B is a diagram illustrating gas supply timing in the fourth film-forming process shown in FIG. 18.

Hereinafter, a fifth embodiment will be described with reference to FIGS. 1 through 3 and FIGS. 18 through 22. FIG. 18 is a process flowchart illustrating an example of a film-forming process in a process flow according to the present embodiment. FIG. 19A is a diagram illustrating gas supply timing in the third film-forming process shown in FIG. 18, and FIG. 19B is a diagram illustrating gas supply timing in the fourth film-forming process shown in FIG. 18.

The first embodiment has been described as an example in which a titanium hafnium nitride (TiHfN) film which is a composite metal nitride film is formed as a gate electrode and a titanium nitride (TiN) film which is a metal nitride film is formed as a cap layer using the substrate processing apparatus shown in FIGS. 1 through 3. However, unlike in the first embodiment, the present embodiment will be described as an example in which a titanium aluminum carbide (TiAlC) film which is a metal carbide film (transition metal carbide film) is formed as a gate electrode, and the same titanium nitride film as in the first embodiment is formed as the cap film. A detailed description of the same components as in the first embodiment is omitted.

As in the first embodiment, an inert gas may be supplied from the nozzles 249a and 249g, $NH_3$ gas may be supplied as a fourth source gas from the nozzle 249b, and $TiCl_4$ gas may be supplied as the first and third sources from the nozzle 249d. However, in the present embodiment, an aluminum source gas (i.e., an aluminum-containing gas) is supplied as a second source (e.g., a second source gas which is a metal-containing gas) from the nozzle 249e into the process chamber 101 via the LMFC 295e, the vaporizer 270e, and the gas filter 281e. For example, trimethylaluminum ($Al(CH_3)_3$, abbreviated as: TMA) may be used as the aluminum-containing gas. TMA is in a liquid state in normal temperature and pressure. TMA is stored in the liquid state as the second source (second liquid source) in the liquid source supply tank 291e.

In the substrate processing process, since the substrate loading process S301, the substrate placing process S302, the pressure adjusting process S303, the temperature adjusting process S304, the second film-forming process [step S405, step S406, step S407, step S408, and step S409], and the substrate unloading process S410 according to the present embodiment are the same as the substrate loading process S101, the substrate placing process S102, the pressure adjusting process S103, the temperature adjusting process S104, the second film-forming process [step S205, step S206, step S207, step S208, and step S209], and the substrate unloading process S210 according to the first embodiment, a description thereof is omitted. Hereinafter, the first film-forming process will be described.

After the temperature adjusting process (S304), a first film-forming process (transition metal carbide film-forming process) of supplying $TiCl_4$ gas and TMA gas onto the wafer 100 to form a titanium aluminum carbide (TiAlC) film as a conductive film is performed. In the first film-forming process, the following four steps are sequentially performed.

[First Film-Forming Process]

<Step S305>

In step S305 (refer to a first process, a transition metal source supply process, and $TiCl_4$ supply process in FIGS. 18 and 19), $TiCl_4$ gas is initially supplied. The valve 233d of the gas supply pipe 232d is opened to supply the $TiCl_4$ gas via the vaporizer 270d and the gas filter 281d into the gas supply pipe 232d. The flow rate of the $TiCl_4$ gas supplied into the gas supply pipe 232d is adjusted by the LMFC 295d. $TiCl_4$ gas, the flow rate of which is adjusted, is supplied from the gas supply pipe 232d via the gas introduction port 110 onto the wafer 100 in the process chamber 101, and exhausted from the exhaust port 161. At the same time, the valve 272d is opened to supply $N_2$ gas as an inert gas into the inert gas supply pipe 271d. The flow rate of the $N_2$ gas supplied into the inert gas supply pipe 271d is adjusted by the MFC 273d. The $N_2$ gas, the flow rate of which is adjusted, is supplied into the process chamber 101 together with the $TiCl_4$ gas, and exhausted from the exhaust port 161. Also, the valve 233a may be opened to supply $N_2$ gas as an inert gas from the gas supply pipe 232a. The valve 233g may be opened to supply $N_2$ gas as an inert gas from the gas supply pipe 232g.

In this case, the APC valve 162 is appropriately adjusted to set the inside of the process chamber 101 to be within a range of, for example, 10 to 1,330 Pa. The supply flow rate of the $TiCl_4$ gas controlled by the LMFC 295d is set to be within, for example, a range of 10 to 100 sccm. A duration for which the wafer 100 is exposed to the $TiCl_4$ gas, i.e., a gas supply time (gas irradiation time), is set to be within, for example, a range of 0.01 to 300 seconds. In this case, the temperature of the heater 106 is set such that the temperature of the wafer 100 falls within, for example, a range of 100 to 400° C., and preferably 200 to 400° C. Due to the supply of the $TiCl_4$ gas, the titanium-containing layer is formed on the wafer 100.

<Step S306>

In step S306 (refer to the second process and the purge process of FIGS. 18 and 19), the valve 233d is closed to stop the supply of $TiCl_4$ gas into the process chamber 101. In this case, the inside of the process chamber 101 is vacuum-exhausted by the vacuum pump 164 while the APC valve 162 is open, thereby eliminating the $TiCl_4$ gas (that does not react or that has contributed to the formation of the titanium-containing layer) remaining in the process chamber 101 from the process chamber 101. In this case, $N_2$ gas is continuously supplied as an inert gas into the process chamber 101 while the valve 233a or the valve 233g is open. The $N_2$ gas acts as a purge gas to increase the effect of eliminating the $TiCl_4$ gas (that does not react or that has contributed to the formation of the titanium-containing layer) remaining in the process chamber 101 from the process chamber 101. The process chamber 101 may be purged by supplying the $N_2$ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, step S307 to be performed thereafter will not be badly influenced by the gas. In this case, the flow rate of the $N_2$ gas to be supplied into the process chamber 101 need not be high. For example, the inside of the process chamber 101 may be purged without causing the next step to be badly influenced by the gas by supplying an amount of a gas corresponding to the capacity of the process container 102 [the process chamber 101]. As described above, when the inside of the process chamber 101 is not completely purged, a purge time may be reduced to improve the throughput. Furthermore, the consumption of the $N_2$ gas may be suppressed to a necessary minimum level.

<Step S307>

In step S307 (refer to the third process, the metal source supply process, and the TMA supply process of FIGS. 18 and 19), TMA gas is initially supplied. The valve 233e of the gas supply pipe 232e is opened, and TMA gas is supplied via the vaporizer 270e and the gas filter 281e into the gas supply pipe 232e. The flow rate of the TMA gas flowing in the gas supply pipe 232e is adjusted by the LMFC 295e. The TMA gas, the flow rate of which is adjusted, is supplied from the gas supply pipe 232e via the gas introduction port 110 onto the wafer 100 in the process chamber 101, and exhausted from the exhaust port 161. At the same time, the valve 272e is opened to supply $N_2$ gas as an inert gas into the inert gas supply pipe 271e. The flow rate of the $N_2$ gas supplied into the inert gas supply pipe 271e is adjusted by the MFC 273e. The $N_2$ gas, the flow rate of which is adjusted, is supplied into the process chamber 101 together with the TMA gas, and exhausted from the exhaust port 161. The valve 233a may be opened to supply $N_2$ gas as an inert gas from the gas supply pipe 232a. The valve 233g may be opened to supply $N_2$ gas as an inert gas from the gas supply pipe 232g.

In this case, the APC valve 162 is appropriately adjusted to set the pressure in the process chamber 101 to be within a range of, for example, 10 to 1,330 Pa. The supply flow rate of the TMA gas controlled by the LMFC 295e is set to be within a range of, for example, 10 to 100 ccm. A duration for which the wafer 100 is exposed to the TMA gas, i.e., a gas supply time (gas irradiation time), is set to be within a range of, for example, 0.01 to 300 seconds. In this case, the temperature of the heater 106 is set such that the temperature of the wafer 100 falls within, for example, a range of 100 to 400° C., and preferably 200 to 400° C. By supplying the TMA gas, a layer containing aluminum and carbon is formed on the wafer 100.

<Step S308>

In step S308 (refer to a fourth process and a purge process in FIGS. 18 and 19), the valve 233e is closed to stop the supply of TMA gas into the process chamber 101. In this case, the inside of the process chamber 101 is vacuum-exhausted by the vacuum pump 164 while the APC valve 162 is open, thereby eliminating the TMA gas (that does not react or that has contributed to the formation of the layer containing aluminum and carbon) remaining in the process chamber 101 from the process chamber 101. In this case, $N_2$ gas is continuously supplied into the process chamber 101 while the valve 233a or the valve 233g is open (or by opening the valve 233a or the valve 233g). The $N_2$ gas acts as a purge gas to increase the effect of eliminating the TMA gas (that does not react or that has contributed to the formation of the layer containing aluminum and carbon) remaining in the process chamber 101 from the process chamber 101. The process chamber 101 may be purged by supplying the $N_2$ gas at a flow rate of, for example, 200 ccm, for example, for 1 to 60 seconds.

In this case, the gas remaining in the process chamber 101 may not be completely eliminated and the inside of the process chamber 101 may not be completely purged. When a small amount of gas remains in the process chamber 101, steps to be performed thereafter will not be badly influenced by the gas. In this case, the flow rate of the $N_2$ gas to be supplied into the process chamber 101 need not be high. For example, the inside of the process chamber 101 may be purged without causing the next step to be badly influenced by the gas by supplying an amount of a gas corresponding to the capacity of the process container 102 [the process chamber 101]. As described above, when the inside of the process chamber 101 is not completely purged, a purge time may be reduced to improve the throughput. Furthermore, the consumption of the $N_2$ gas may be suppressed to a necessary minimum level.

<Step S309>

By performing a cycle including the above-described steps S305 to S308 at least once [step S109], a conductive film containing titanium, aluminum, and carbon, i.e., a titanium aluminum carbide (TiAlC) film, may be formed on the wafer 100 to a predetermined thickness. Thus, the TiAlC film is formed on the wafer 100 to a predetermined thickness.

After the TiAlC film is formed, the valve 233a of the inert gas supply pipe 232a or the valve 233g of the inert gas supply pipe 232g is opened to supply $N_2$ gas into the process chamber 101. The $N_2$ gas acts as a purge gas. Thus, the inside of the process chamber 101 is purged with the inert gas, and gases remaining in the process chamber 101 are removed from the inside of the process chamber 101. Thereafter, a second film-forming process of forming a cap film is performed.

Although an example in which TMA is used as a metal-containing gas has been described, the present invention is not limited thereto. The metal-containing gas may be triethylaluminum ($Al(C_2H_5)_3$), triisobutylaluminum ($Al(C_4H_9)_3$), or tris(dimethylamino)aluminum ($Al[N(CH_3)_2]_3$) or may be a source containing any one of boron (B), hafnium (Hf), tantalum (Ta), silicon (Si), and zirconium (Zr) or at least two thereof. For example, a source, such as tetrakis(diethylamino)hafnium ($Hf[N(C_2H_5)_2]_4$), tetrakis(dimethylamino)hafnium ($Hf[N(CH_3)_2]_4$), tetrakis(ethylmethylamino)hafnium ($Hf[N(C_2H_5)CH_3]_4$), tetrakis(diethylamino)zirconium ($Zr(N(C_2H_5)_2]_4$), tetrakis(dimethylamino)zirconium ($Zr[N(CH_3)_2]_4$), tetrakis(ethylmethylamino)zirconium ($Zr[N(C_2H_5)CH_3]_4$), tert-butylimino tris(ethylmethylamino)tantalum (TBTEMT), tert-butylimino tris(diethylamino)tantalum (TBTDET), diborane ($B_2H_6$), or disilane ($Si_2H_6$) may be stored in the liquid source supply tank 291e, or the first liquid source may be stored.

[Effects of the Present Embodiment]

According to the present embodiment, one or a plurality of the following effects may be obtained.

Figure 20:
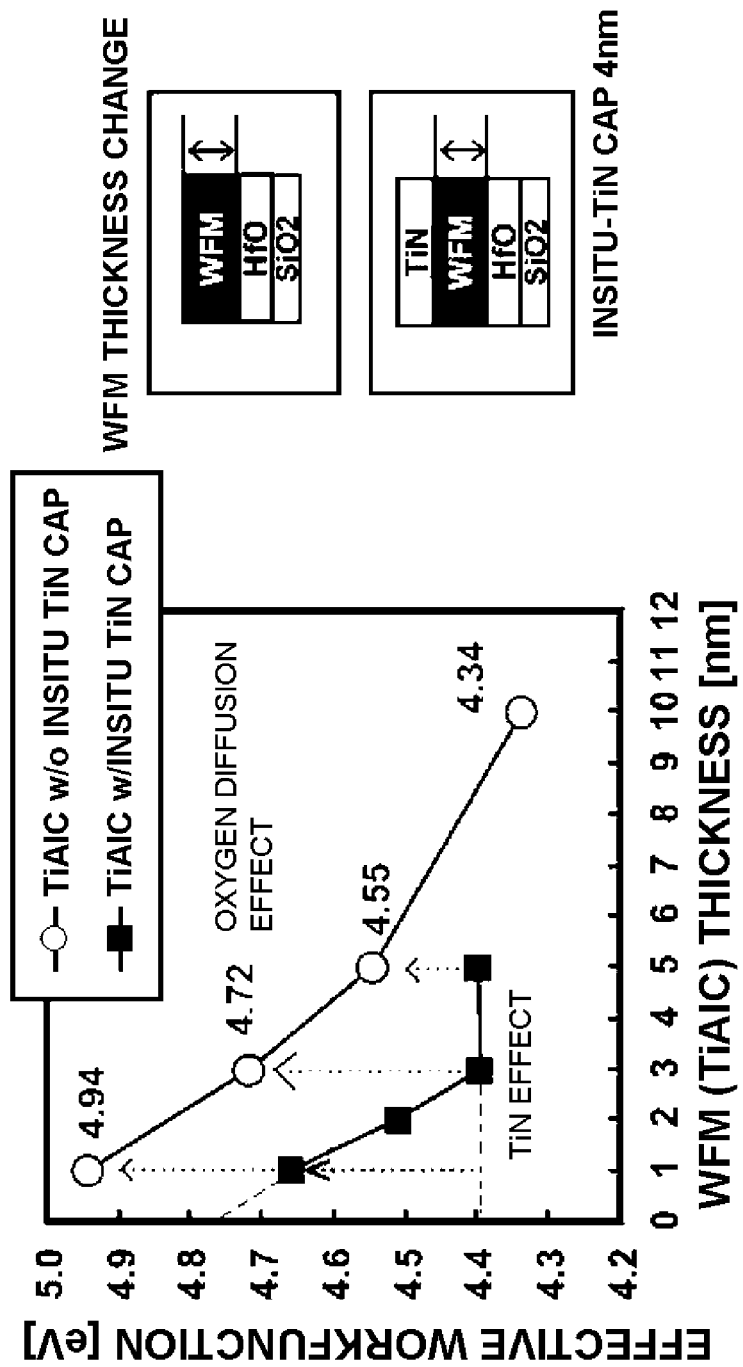
FIG. 20 is a diagram illustrating characteristics of a film formed using a method described in the fifth exemplary embodiment.

(a) According to the present embodiment, oxidation of a transition-metal-containing carbide film may be prevented. As shown in FIG. 20, after titanium aluminum carbide is formed as a transition-metal-containing carbide film, when a titanium nitride film is formed as a cap film in situ, a rise in work function due to the oxidation may be prevented.

(b) When the transition-metal-containing carbide film is formed as a thin film, a work function of a bulk may be maintained. As shown in FIG. 20, when a titanium aluminum carbide film is formed as the transition-metal carbide film to a small thickness of 3 to 5 nm, a work function may also be maintained.

Figure 21:
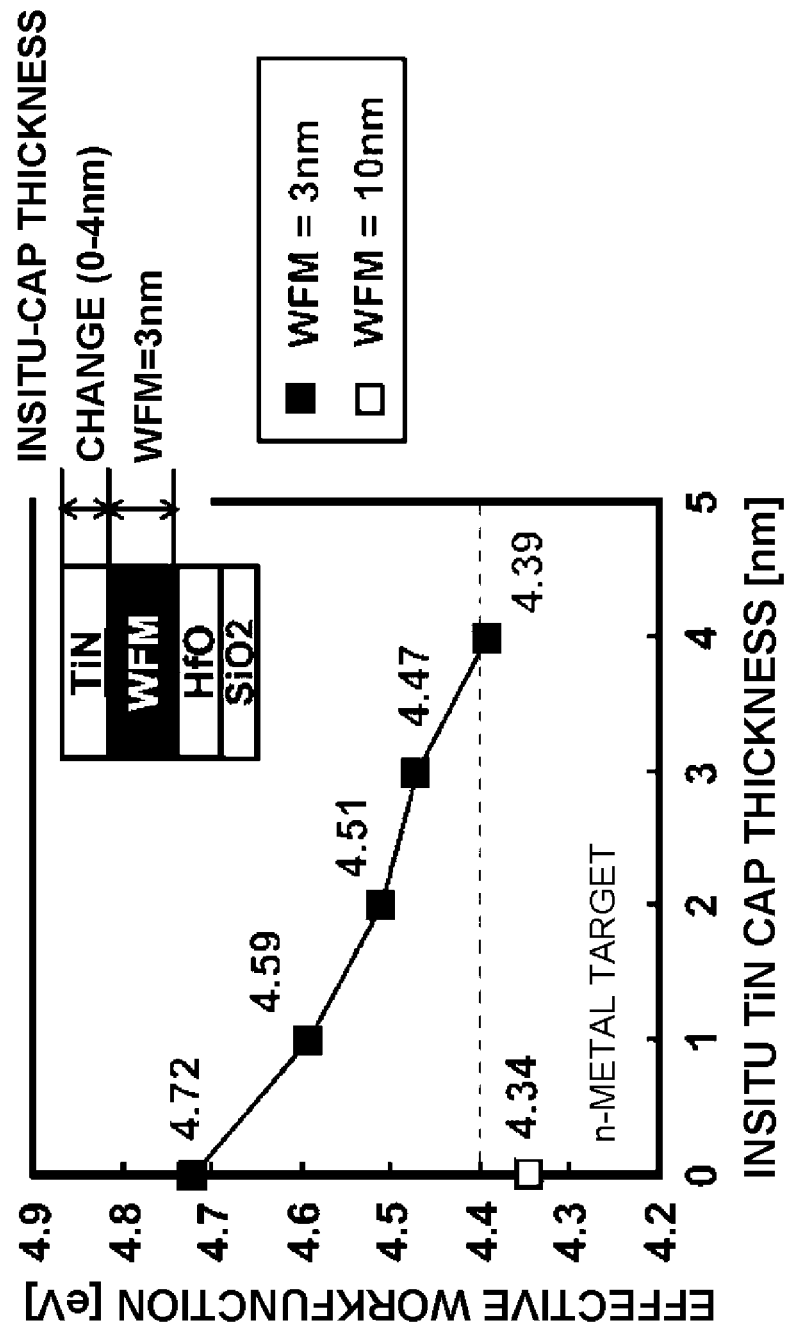
FIG. 21 is a diagram illustrating an effective work function when the thickness of a cap film is varied.

(c) By increasing the thickness of the titanium nitride film as the cap layer, an effective work function may be reduced. As shown in FIG. 21, when the thickness of the titanium nitride film is increased, the effective work function may be reduced.

Figure 22:
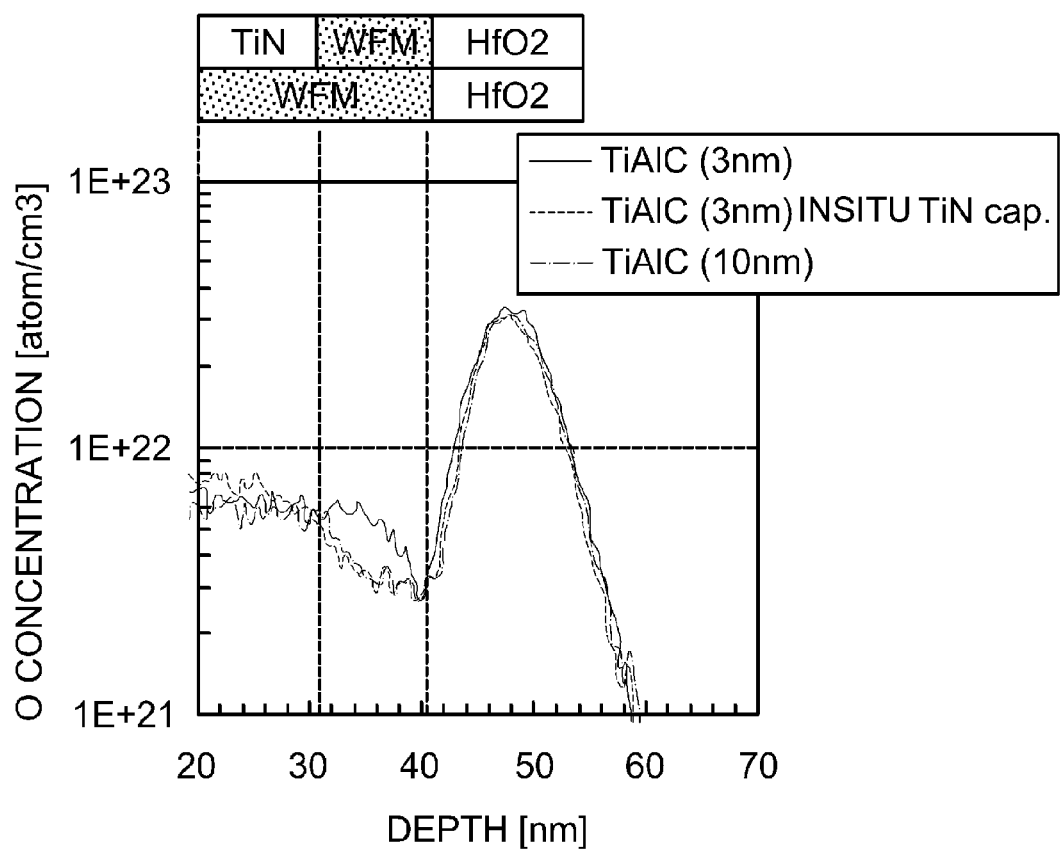
FIG. 22 is a diagram illustrating an oxygen concentration in a film depending on the presence or absence of a cap film.

(d) When the transition-metal-containing carbide film is formed as a thin film, an oxygen concentration of the transition-metal-containing carbide film may be reduced by forming the titanium nitride film in situ. As shown in FIG. 22, a titanium aluminum carbide film is formed to a thickness of 3 nm, and an oxygen concentration of a titanium aluminum carbide film of a sample in which titanium nitride has been deposited in situ may be set to be about equal to an oxygen concentration of a sample in which a titanium aluminum carbide film has been formed to a great thickness of 10 nm.

[Sixth Embodiment]

Figure 23:
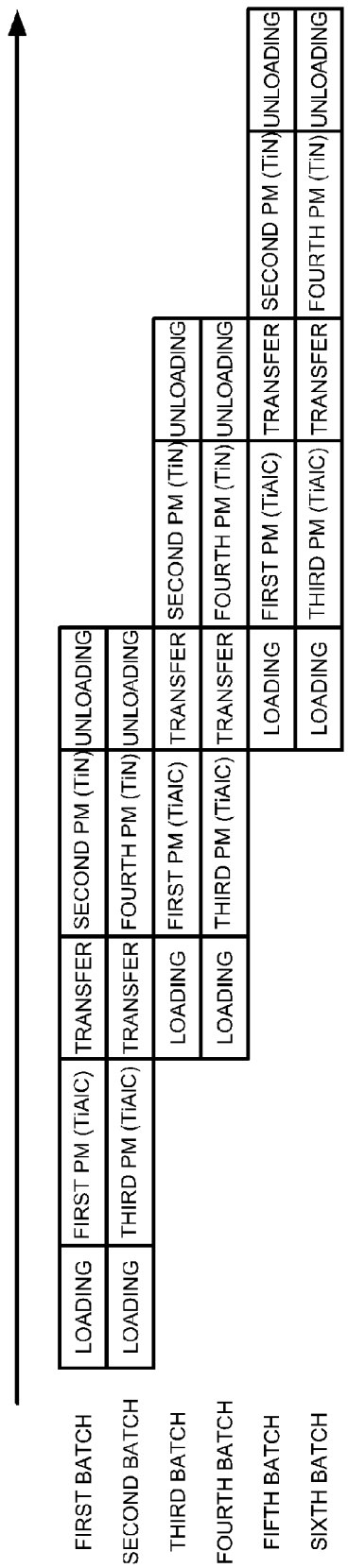
FIG. 23 is a diagram illustrating a transfer sequence of a substrate according to a sixth exemplary embodiment.

As in the second embodiment, in the present embodiment, a titanium aluminum carbide (TiAlC) film which is a metal carbide film (transition metal carbide film) is formed as a gate electrode under the same process conditions as in the fifth embodiment using a plurality of process containers, and the same titanium nitride (TiN) film as in the first embodiment is formed as a cap film. FIG. 23 is a diagram illustrating a substrate transfer sequence according to the present embodiment.

[Seventh Embodiment]

In the present embodiment, a titanium aluminum carbide (TiAlC) film which is a metal carbide film (transition metal carbide film) is formed as a gate electrode, and the same titanium nitride film as in the first embodiment is formed as a cap film under the same process conditions as in the fifth embodiment using the same substrate processing apparatus as in the third embodiment.

[Eighth Embodiment]

In the present embodiment, when a plurality of wafers 100 are stacked and processed using the same substrate processing apparatus as in the third embodiment, a titanium aluminum carbide (TiAlC) film which is a metal carbide film (transition metal carbide film) is formed as a gate electrode, and the same titanium nitride film as in the first embodiment is formed as a cap layer under the same process conditions as in the fifth embodiment.

[Other Embodiments]

Hereinafter, other embodiments will be described. Although the previous embodiment has been described as a process of forming a titanium nitride film which is a cap layer without exposing a wafer having a titanium hafnium nitride film to an oxygen-containing atmosphere, the previous embodiment is not limited thereto. By preventing adsorption of oxygen to an interface between the titanium hafnium nitride film and the titanium nitride film, the same effects may be obtained. That is, after exposing the titanium hafnium nitride film on which a native oxide film is formed (to which oxygen is adsorbed) to a reducing atmosphere (e.g., reducing gas or reducing plasma), the titanium nitride film may be formed.

Although the present embodiment has been described as a case in which the same source ($TiCl_4$) is used as the first source and the third source, the first and second sources may contain different metal elements.

The present embodiment has been described as a process of forming a titanium nitride film as a cap layer without exposing a substrate having a titanium aluminum carbon (TiAlC) film as a conductive film to an oxygen-containing atmosphere, but the present embodiment is not limited thereto. By preventing adsorption of oxygen to an interface between the TiAlC film and the TiN film, the same effects may be obtained. That is, after exposing the TiAlC film on which a native oxide film is formed (to which oxygen is adsorbed) to a reducing atmosphere (e.g., reducing gas or reducing plasma), the TiN film may be formed.

The present embodiment has been described as a technique of forming a transition metal carbide (TiAlC) film using two gases, i.e., the transition metal source (TiCl$_4$) and the metal source (TMA). However, the present embodiment is not limited to the technique, and the transition metal carbide film may be formed using a source containing a transition metal (titanium), a metal (aluminum)-containing source, and a carbon-containing source. Also, the transition metal carbide film may be formed by supplying a source containing a transition metal (titanium) and carbon and a source containing a metal (aluminum) and carbon.

The present embodiment has been described as an example in which the titanium aluminum carbon film and the titanium nitride film are formed, but the present embodiment is not limited thereto. Any one or at least two of TaAlC, TaN, WAlC, WN, WC, WSiN, WBC, WSiBN, WBCN, Ni, Ru, and Co may be formed. For example, when WSiBN is formed, the gas supply pipe 232d shown in FIG. 2 is replaced with a line configured to supply WF, and the gas supply pipe 232e is replaced with a line configured to supply a silicon source. Also, by adding the gas supply pipe 232c and the gas supply pipe 232f to supply a boron (B) source as a third source from the gas supply pipe 232c and supply a carbon source as a fourth source from the gas supply pipe 232f, a multi-element-based film, such as WSiBN, may be formed. In addition to boron, the third source may contain any one or at least two of silicon, carbon, and aluminum.

Although the present embodiment has been described as a case in which N$_2$ gas is used as an inert gas, the present embodiment is not limited thereto. A rare gas, such as argon (Ar) gas, helium (He) gas, neon (Ne) gas, or xenon (Xe) gas, may be used as the inert gas. Also, after the transition metal carbide film is formed or between the formation of the transition metal carbide film and the formation of the cap film, a reducing [hydrogen-containing] gas may be used. For example, when a purge process is performed between the first and second film-forming processes, adsorption of oxygen may be prevented using the reducing gas as the inert gas. Also, oxidation of the transition metal carbide film may be inhibited by exciting the reducing gas. By setting a transfer atmosphere to be a reducing atmosphere when substrates are moved to a plurality of process chambers and processed, the same effects may be obtained.

The present invention is realized by modifying, for example, a gas supply system of a conventional substrate processing apparatus used in a process of manufacturing a semiconductor device and changing a process recipe. When the process recipe is changed, the process recipe according to the present invention may be installed in the conventional substrate processing apparatus via an electrical communication line or a recording medium storing the process recipe. Alternatively, an I/O device of the conventional substrate processing apparatus may be manipulated, and the process recipe itself may be replaced with the process recipe according to the present invention.

While a film-forming technique according to various typical embodiments of the present invention has been described, the present invention is not limited thereto. For example, the present invention may be applied to not only formation of various films, such as an oxide film, a nitride film, a metal film, etc., but also other substrate processing processes, such as a diffusion process, an oxidation process, a nitridation process, a lithography process, etc. Also, the present invention may be applied to not only an annealing processing apparatus but also another substrate processing apparatus, such as a thin film-forming apparatus, an etching apparatus, an oxidation apparatus, a nitridation apparatus, a coating apparatus, a heating apparatus, etc. Also, the present invention may be applied to a mixture of the above-described apparatuses.

[Preferred Embodiments of the Present Invention]

Preferred embodiments of the present invention will be supplementarily described below.

[Supplementary Note 1]

According to one aspect of the present invention, there is provided a method of manufacturing a semiconductor device, the method including: alternately supplying a first source containing a first metal element and a halogen element and a second source containing a second metal element different from the first metal element and an amino group to a substrate having a high-k dielectric film to form a composite metal nitride film on the high-k dielectric film.

[Supplementary Note 2]

According to another aspect of the present invention, there is provided a method of manufacturing a semiconductor device, the method including: loading a substrate having a high-k dielectric film into a process chamber; alternately supplying a first source containing a first metal element and a halogen element and a second source containing a second metal element different from the first metal element and an amino group onto the substrate in the process chamber to form a composite metal nitride film on the high-k dielectric film; and alternately supplying a third source containing a third metal element and a fourth source containing nitrogen onto the substrate in the process chamber to form a metal nitride film on the composite metal nitride film.

[Supplementary Note 3]

The method of Supplementary note 1 or 2, wherein the first metal element is a transition metal element.

[Supplementary Note 4]

The method of any one of Supplementary notes 1 through 3, wherein the second metal element is a transition metal element.

[Supplementary Note 5]

The method of any one of Supplementary notes 1 through 4, wherein the second source contains any one of tetrakis (diethylamino)hafnium (Hf[N(C$_2$H$_5$)$_2$]$_4$, abbreviated as: TDEAHf), tetrakis(dimethylamino)hafnium (Hf[N(CH$_3$)$_2$]$_4$, abbreviated as: TDMAHf), or tetrakis(ethylmethylamino) hafnium (Hf[N(C$_2$H$_5$)CH$_3$]$_4$, abbreviated as TEMAHf).

[Supplementary Note 6]

The method of any one of Supplementary notes 1 through 5, wherein the first source contains TiCl$_4$.

[Supplementary Note 7]

The method of any one of Supplementary notes 1 through 6, wherein the transition metal element of the first metal element contains at least one element selected from a group consisting of titanium (Ti), tungsten (W), tantalum (Ta), zirconium (Zr), hafnium (Hf), ruthenium (Ru), nickel (Ni), and cobalt (Co).

[Supplementary Note 8]

The method of any one of Supplementary notes 1 through 7, wherein the transition metal element of the second metal element contains at least one element selected from a group consisting of Ti, W, Ta, Zr, Hf, Ru, Ni, and Co.

[Supplementary Note 9]

The method of any one of Supplementary notes 1 through 8, wherein a ligand of the amino group of the second source contains any one of an ethyl group, a methyl group, and a cyclopenta-based group.

[Supplementary Note 10]

The method of Supplementary note 2, wherein the third metal element is a transition metal element.

[Supplementary Note 11]

The method of Supplementary note 2 or 10, wherein the transition metal element of the third metal element contains at least one element selected from a group consisting of Ti, W, Ta, Zr, Hf, Ru, Ni, and Co.

[Supplementary Note 12]

The method of any one of Supplementary notes 2, 10, and 11, wherein the first metal element is same as the third metal element.

[Supplementary Note 13]

The method of any one of Supplementary notes 2, and 10 through 12, wherein the first source and same as the third source.

[Supplementary Note 14]

The method of any one of Supplementary notes 1 through 13, wherein, when the composite metal nitride film is formed, a process temperature is set to be in the range of 330 to 350° C.

[Supplementary Note 15]

The method of any one of Supplementary notes 1 through 14, wherein, when the first source and the second source are alternately supplied, a supply time of the second source per cycle is set to be in the range of 10 to 30 seconds.

[Supplementary Note 16]

According to another aspect of the present invention, there is provided a substrate processing method including alternately supplying a first source containing a first metal element and a halogen element and a second source containing a second metal element different from the first metal element and an amino group to a substrate having a high-k dielectric film to form a composite metal nitride film on the high-k dielectric film.

[Supplementary Note 17]

According to another aspect of the present invention, there is provided a substrate processing method including: loading a substrate having a high-k dielectric film into a process chamber; alternately supplying a first source containing a first metal element and a halogen element and a second source containing a second metal element different from the first metal element and an amino group onto the substrate in the process chamber to form a composite metal nitride film on the high-k dielectric film; and alternately supplying a third source containing a third metal element and a fourth source containing nitrogen onto the substrate in the process chamber to form a metal nitride film on the composite metal nitride film.

[Supplementary Note 18]

According to another aspect of the present invention, there is provided a substrate processing apparatus including: a process chamber configured to accommodate a substrate having a high-k dielectric film; a first source supply system configured to supply a first source containing a first metal element and a halogen element into the process chamber; a second source supply system configured to supply a second source containing a second metal element different from the first metal element and an amino group into the process chamber; and a control unit configured to control the first source supply system and the second source supply system to execute a process of alternately supplying the first source and the second source into the process chamber to form a composite metal nitride film on the high-k dielectric film.

[Supplementary Note 19]

According to another aspect of the present invention, there is provided a substrate processing apparatus including: a process chamber configured to accommodate a substrate having a high-k dielectric film; a first source supply system configured to supply a first source containing a first metal element and a halogen element into the process chamber; a second source supply system configured to supply a second source containing a second metal element different from the first metal element and an amino group into the process chamber; a third source supply system configured to supply a third source containing a third metal element into the process chamber; a fourth source supply system configured to supply a fourth source containing nitrogen into the process chamber; and a control unit configured to control the first source supply system and the second source supply system to execute a process of alternately supplying the first source and the second source into the process chamber to form a composite metal nitride film on the high-k dielectric film, and configured to control the third source supply system and the fourth source supply system to execute a process of alternately supplying the third source and the fourth source to form a metal nitride film on the composite metal nitride film.

[Supplementary Note 20]

According to another aspect of the present invention, there is provided a program for causing a computer to perform a sequence of alternately supplying a first source containing a first metal element and a halogen element and a second source containing a second metal element different from the first metal element and an amino group onto a substrate having a high-k dielectric film to form a composite metal nitride film on the high-k dielectric film.

[Supplementary Note 21]

According to another aspect of the present invention, there is provided a program for causing a computer to perform: a sequence of loading a substrate having a high-k dielectric film into a process chamber; a sequence of alternately supplying a first source containing a first metal element and a halogen element and a second source containing a second metal element different from the first metal element and an amino group onto the substrate in the process chamber to form a composite metal nitride film on the high-k dielectric film; and a sequence of alternately supplying a third source containing a third metal and a fourth source containing nitrogen onto the substrate in the process chamber to form a metal nitride film on the composite metal nitride film.

[Supplementary Note 22]

According to another aspect of the present invention, there is provided a non-transitory computer-readable recording medium storing a program for causing a computer to perform a sequence of alternately supplying a first source containing a first metal element and a halogen element and a second source containing a second metal element different from the first metal element and an amino group onto a substrate having a high-k dielectric film to form a composite metal nitride film on the high-k dielectric film.

[Supplementary Note 23]

According to another aspect of the present invention, there is provided a non-transitory computer-readable recording medium storing a program for causing a computer to perform: a sequence of loading a substrate having a high-k dielectric film into a process chamber; a sequence of alternately supplying a first source containing a first metal element and a halogen element and a second source containing a second metal element different from the first metal element and an amino group onto the substrate in the process chamber to form a composite metal nitride film on the high-k dielectric film; and a sequence of alternately supplying a third source containing a third metal element and a fourth source containing nitrogen onto the substrate in the process chamber to form a metal nitride film on the composite metal nitride film.

[Supplementary Note 24]

According to another aspect of the present invention, there is provided a method of manufacturing a semiconductor device, including: a process of accommodating a substrate having a high-k dielectric film; a first film-forming process of forming a transition metal carbide film on the high-k dielectric film; and a second film-forming process of forming a metal-containing film on the transition metal carbide film.

[Supplementary Note 25]

The method of Supplementary note 24, wherein, in the first film-forming process, a first source containing a transition metal and a second source containing a metal and carbon are alternately supplied.

[Supplementary Note 26]

The method of Supplementary note 24, wherein, in the first film-forming process, a first source containing a transition metal and carbon and a second source containing a metal are alternately supplied.

[Supplementary Note 27]

The method of Supplementary note 24, wherein, in the first film-forming process, a first source containing a transition metal and carbon and a second source containing a metal and carbon are alternately supplied.

[Supplementary Note 28]

The method of Supplementary note 24, wherein, in the first film-forming process, a first source containing a transition metal, a second source containing a metal, and a third source containing carbon are alternately supplied.

[Supplementary Note 29]

The method of any one of Supplementary notes 24 or 25, wherein, in the second film-forming process, a first source containing a transition metal and a reactive gas containing a nitrogen source are alternately supplied.

[Supplementary Note 30]

The method of any one of Supplementary note 24 or 25, wherein, in the second film-forming process, a first source containing a transition metal, a reactive gas containing a nitrogen source, and a third source containing any one of boron (B), carbon (C), silicon (Si), and aluminum (Al) or at least two thereof are sequentially supplied.

[Supplementary Note 31]

The method of any one of Supplementary notes 24 through 26, further including a process of retaining a time space between the first film-forming process and the second film-forming process using an inert gas.

[Supplementary Note 32]

The method of any one of Supplementary notes 24 through 26, further including a process of supplying a reducing gas after the first film-forming process and performing the second film-forming process after the process of supplying the reducing gas.

[Supplementary Note 33]

The method of any one of Supplementary notes 24 through 26, further including a process of supplying a reducing gas before the second film-forming process.

[Supplementary Note 34]

The method of any one of Supplementary notes 31 through 33, wherein the process of supplying the reducing gas includes a process of exciting the reducing gas.

[Supplementary Note 35]

The method of any one of Supplementary notes 24 through 34, wherein the high-k dielectric film has a dielectric constant of 4.0 or more.

[Supplementary Note 36]

The method of any one of Supplementary notes 24 through 32, wherein the high-k dielectric film is formed of any one of ZrO, HfO, LaO, YO, TaO, CeO, TiO, AlO, SiO, SiN, STO, and BTO or a combination of at least two thereof.

[Supplementary Note 37]

The method of any one of Supplementary notes 24 through 33, wherein the film formed in the first film-forming process has a thickness of 5 nm or less, and a film formed in the second film-forming process has a thickness of 1 nm or more.

[Supplementary Note 38]

The method of any one of Supplementary notes 24 through 34, wherein the film formed in the second film-forming process contains a transition metal.

[Supplementary Note 39]

The method of any one of Supplementary notes 24 through 35, wherein the transition metal contains any one of Ti, W, Ta, Zr, Hf, Ru, Ni, and Co or at least two thereof.

[Supplementary Note 40]

The method of any one of Supplementary notes 24 through 36, wherein the film formed in the first film-forming process and the film formed in the second film-forming process contain any one of boron, carbon, silicon, and aluminum or at least two thereof.

[Supplementary Note 41]

According to another aspect of the present invention, there is provided a method of manufacturing a semiconductor device including: a process of accommodating a substrate having a high-k dielectric film and a transition-metal-containing carbide film formed on the high-k dielectric film; and a process of forming a film containing a transition metal on the substrate.

[Supplementary Note 42]

The method of Supplementary note 41, further including a process of supplying a reducing gas before the process of forming the film containing the transition metal.

[Supplementary Note 43]

The method of Supplementary note 41, wherein the process of supplying the reducing gas includes a process of exciting the reducing gas.

[Supplementary Note 44]

According to still another aspect of the present invention, there is provided a program for causing a computer to perform: a sequence of accommodating a substrate having a high-k dielectric film; a first film-forming sequence of forming a transition metal carbide film on the substrate; and a second film-forming sequence of forming a metal-containing film on the transition metal carbide film.

[Supplementary Note 45]

According to yet another aspect of the present invention, there is provided a program for causing a computer to perform a sequence of accommodating a substrate having a high-k dielectric film and a transition-metal-containing carbide film; and a sequence of forming a film containing a transition metal on the substrate.

[Supplementary Note 46]

According to yet another aspect of the present invention, there is provided a non-transitory computer-readable recording medium storing a program for causing a computer to perform: a sequence of accommodating a substrate having a high-k dielectric film; a sequence of forming a transition metal carbide film containing at least one layer containing a metal and a transition metal on the substrate; and a sequence of forming a metal film containing a transition metal on the substrate.

[Supplementary Note 47]

According to yet another aspect of the present invention, there is provided a substrate processing apparatus including: a process chamber configured to accommodate a substrate having a high-k dielectric film; a transition metal source supply unit configured to supply a transition metal source containing a transition metal onto the substrate; a metal source supply unit configured to supply a metal source containing a metal and carbon onto the substrate; a reactive gas supply unit configured to supply a nitrogen-containing reactive gas onto the substrate; and a control unit configured to control the transition metal source supply unit, the metal source supply unit, and the reactive gas supply unit such that the transition metal source and the metal source are alternately supplied to form a transition metal carbide film, and the transition metal source and the reactive gas are alternately supplied to form a transition metal-containing film after forming the transition metal carbide film.

The invention claimed is:

1. A method of manufacturing a semiconductor device, comprising:
   loading a substrate having a high-k dielectric film into a process chamber;
   alternately supplying a first source containing a first metal element and a halogen element and a second source containing a second metal element different from the first metal element and an amino group onto the substrate in the process chamber to form a composite metal nitride film on the high-k dielectric film; and
   alternately supplying a third source containing a third metal element and a fourth source containing nitrogen onto the substrate in the process chamber to form a metal nitride film on the composite metal nitride film.

2. The method of claim 1, wherein the first metal element contains at least one element selected from a group consisting of titanium, tungsten, tantalum, zirconium, hafnium, ruthenium, nickel, and cobalt.

3. The method of claim 1, wherein the second metal element contains at least one element selected from a group consisting of titanium, tungsten, tantalum, zirconium, hafnium, ruthenium, nickel, and cobalt.

4. The method of claim 1, wherein a ligand of the amino group of the second source contains at least one of an ethyl group, a methyl group, and a cyclopenta-based group.

5. The method of claim 1, wherein the third metal element contains at least one element selected from a group consisting of titanium, tungsten, tantalum, zirconium, hafnium, ruthenium, nickel, and cobalt.

6. The method of claim 1, wherein the first metal element is same as the third metal element.

* * * * *